(12) United States Patent
Takahashi et al.

(10) Patent No.: US 7,635,014 B2
(45) Date of Patent: Dec. 22, 2009

(54) METHOD FOR PRESSURE BONDING AND METHOD FOR MANUFACTURING SEMICONDUCTOR DEVICE

(75) Inventors: Hidekazu Takahashi, Kanagawa (JP); Naoto Kusumoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 376 days.

(21) Appl. No.: 11/591,776

(22) Filed: Nov. 1, 2006

(65) Prior Publication Data

US 2007/0107827 A1 May 17, 2007

(30) Foreign Application Priority Data

Nov. 11, 2005 (JP) ............................. 2005-328030

(51) Int. Cl.
*B29C 65/00* (2006.01)
(52) U.S. Cl. .................. 156/358; 156/350; 156/351; 156/64; 156/378; 156/235
(58) Field of Classification Search .................. 156/350, 156/351, 358, 64, 378, 235, 272
See application file for complete search history.

(56) References Cited

U.S. PATENT DOCUMENTS 6,033,987 A * 3/2000 Lin et al. ..................... 438/692

| 2005/0135181 A1 | 6/2005 | Shionoiri et al. |
| 2005/0168339 A1* | 8/2005 | Arai et al. ................. 340/572.8 |
| 2006/0086805 A1 | 4/2006 | Oozeki et al. |

FOREIGN PATENT DOCUMENTS

| EP | 1 536 373 A1 | 6/2005 |
| JP | 10-321674 | 12/1998 |
| JP | 2004-094839 | * 3/2004 |
| JP | 2005-276947 | 10/2005 |

* cited by examiner

*Primary Examiner*—Kahnh Nguyen
*Assistant Examiner*—Vishal I Patel
(74) *Attorney, Agent, or Firm*—Cook Alex Ltd.

(57) ABSTRACT

The substrate is placed over a pressure detection film, the element group is placed selectively over the substrate so that a conductive film functioning as an antenna formed over the substrate and a conductive film functioning as a bump formed over the element group overlap each other, the substrate and the element group are pressure-bonded to each other by applying pressure to the substrate and the element group so that the conductive film formed over the substrate and the conductive film functioning as a bump formed over the element group are electrically connected to each other, a value and distribution of pressure applied to the element group at the time of the pressure bonding are detected by the pressure detection film, and the pressure applied at the time of the pressure bonding is controlled, based on the detected pressure value and pressure distribution.

38 Claims, 15 Drawing Sheets

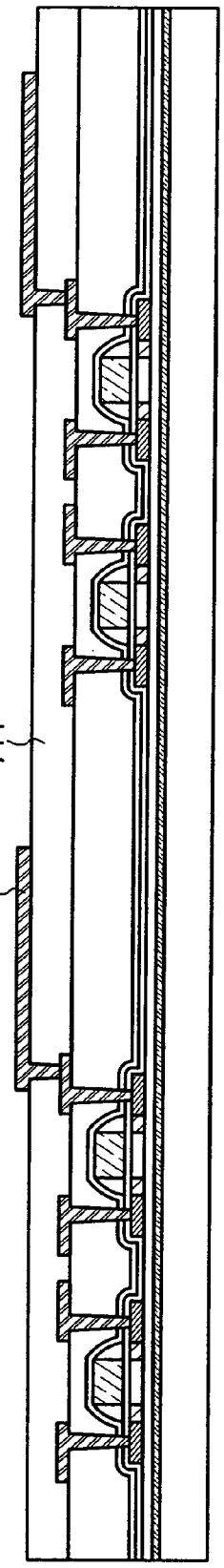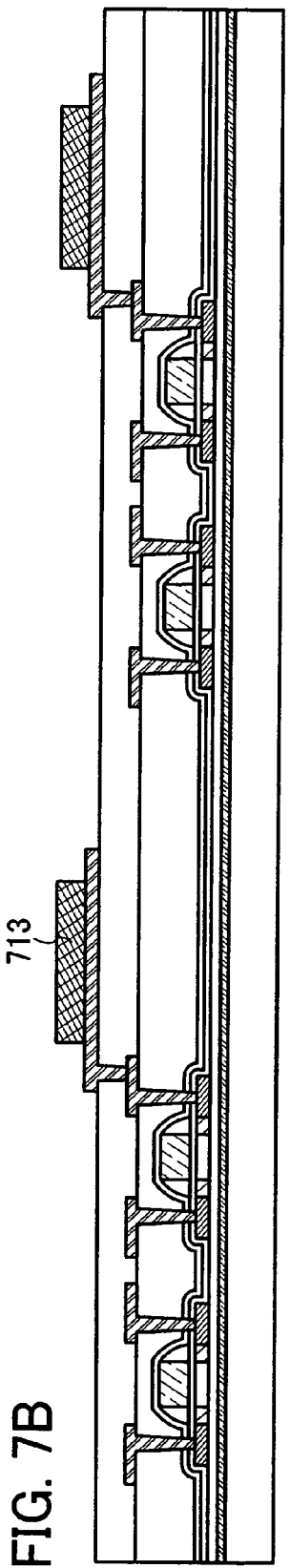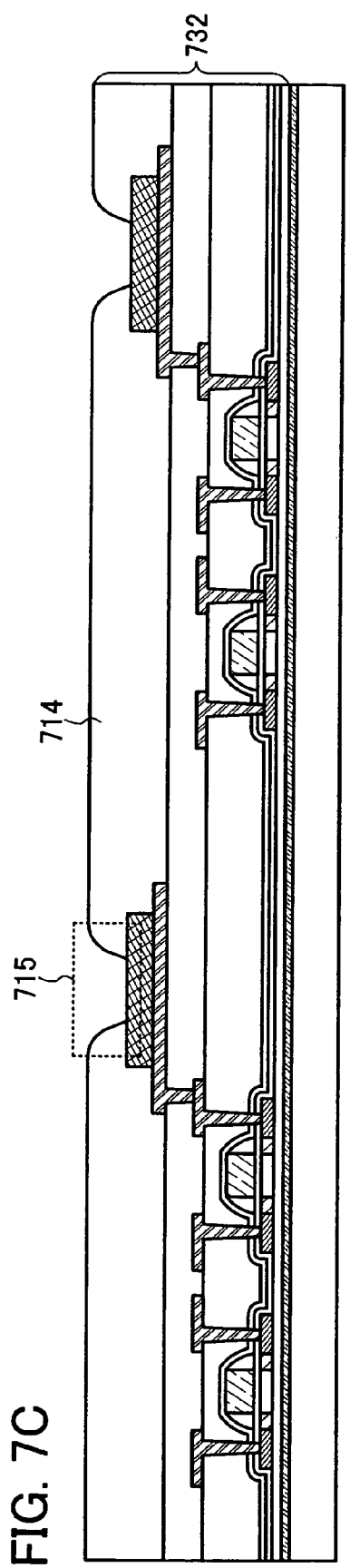

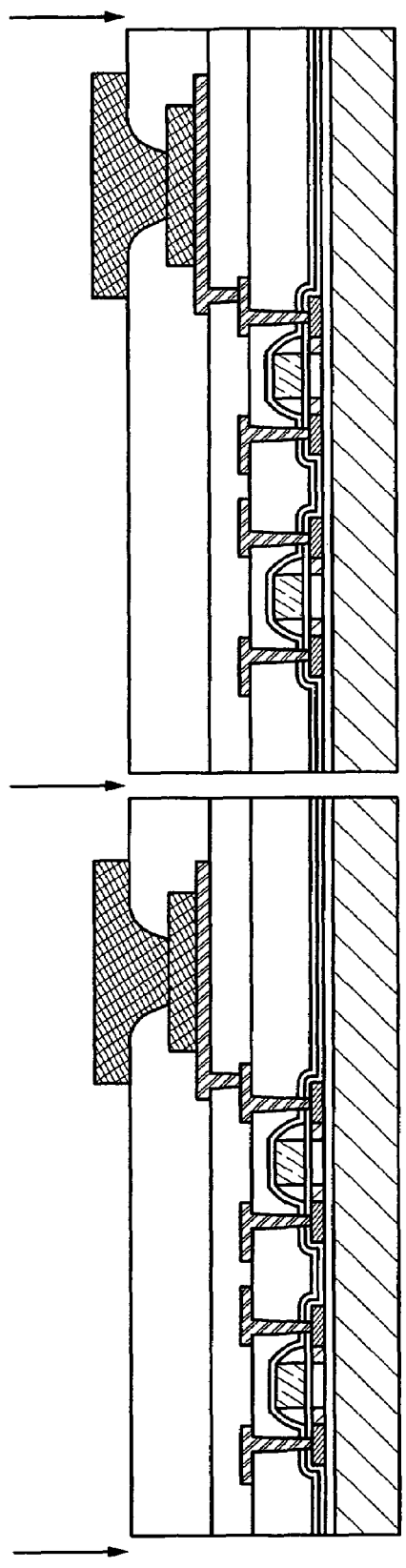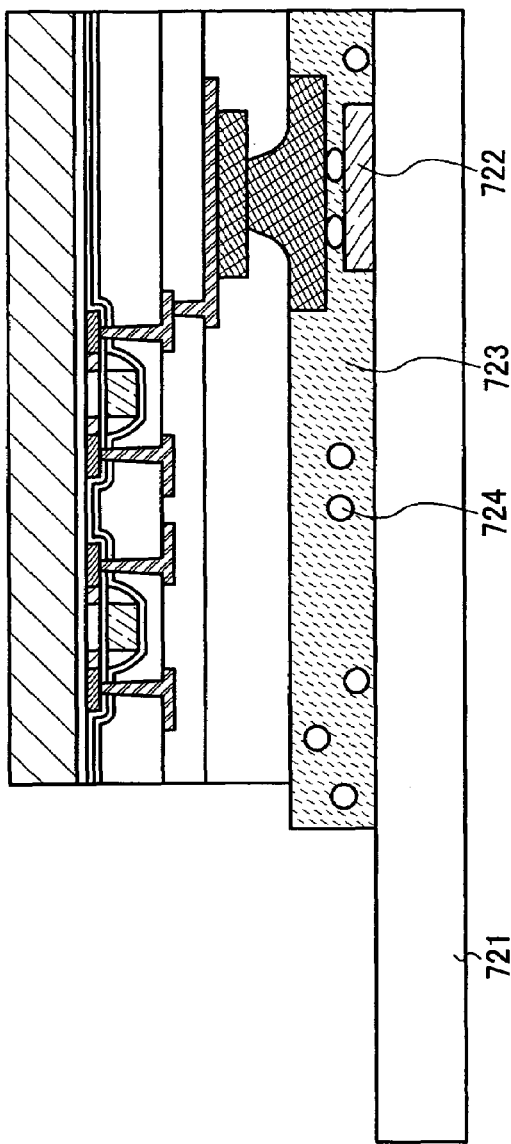
FIG. 10A
FIG. 10B

```
              CHECK          ☐
PAYMENT
PLACE    BANK    BRANCH
AMOUNT OF  ¥ 1,234,567
MONEY
ISSUE DATE        YEAR MONTH DAY
                  Co. Ltd.
  ISSUE PLACE   ISSUING PERSON  SEAL
            REPRESENTATIVE
                                  20
```

```
NAME HEISEI YEAR MONTH DAY BORN
DOMICILE KANAGAWA-KEN
ADDRESS TOKYO-TO
GRANT HEISEI YEAR MONTH DAY
EFFECTIVE UNTIL BIRTHDAY OF
HEISEI 20 YEAR

NUMBER
OTHER
                              20
```

METHOD FOR PRESSURE BONDING AND METHOD FOR MANUFACTURING SEMICONDUCTOR DEVICE

BACKGROUND OF THE INVENTION

1. Field of the Invention

The present invention relates to a pressure bonding apparatus and a pressure bonding method which are used in attaching an element to a substrate or the like, as well as a manufacturing method of a semiconductor device using the pressure bonding apparatus and pressure bonding method.

2. Description of the Related Art

In recent years, individual recognition technology has received a lot of attention. For example, there is a technology to be used for production and management, in which information such as a history of the object is clarified by giving an ID (an individual recognition number) to an individual object. Above all, the development of semiconductor devices that can input and output data without contact has been advanced. As such semiconductor devices, for example, an RFID tag (Radio Frequency Identification) (also referred to as an ID tag, an IC tag, an IC chip, an RF tag (Radio Frequency), a wireless tag, an electronic tag, or a wireless chip) and the like are beginning to be introduced into companies, markets, and the like.

Usually, the above-described semiconductor device that can input and output data without contact includes an element group including an element such as a transistor, and a conductive film functioning as an antenna electrically connected to the element group. The element group and the conductive film functioning as an antenna are formed separately, and then the element group including a transistor or the like is attached to a substrate over which the conductive film functioning as an antenna is formed (Patent Document 1: Japanese Published Patent Application No. 2004-94839, for example).

When a conductive film formed over a substrate and an element group including a transistor and the like are attached to each other so as to be electrically connected, they are attached via a conductive adhesive or the like by applying pressure or a heat treatment to the substrate and the element group. However, there is a possibility that more pressure than needed is applied to the element group and an element such as a transistor is damaged, depending on a condition such as applied pressure or heat. On the other hand, in a case where pressure to be applied at the time of pressure bonding is reduced so as to suppress damage to the element such as a transistor, there is a possibility that the substrate and the element group are not attached firmly enough to each other, leading to a connection failure.

SUMMARY OF THE INVENTION

In view of the foregoing problem, it is an object of the present invention to provide a pressure bonding apparatus and a pressure bonding method which can attach an element group including an element such as a transistor to a substrate so that the element group and the substrate are sufficiently connected to each other and prevent the element from being damaged in attaching; and a manufacturing method of a semiconductor device.

One feature of a pressure bonding method of the present invention is to include the steps of: placing a substrate over a pressure detection film; placing an element group over the substrate selectively so that a first conductive film formed over the substrate and a second conductive film formed over the element group overlap each other; pressure-bonding the substrate and the element group so that the first conductive film formed over the substrate and the second conductive film formed over the element group are electrically connected to each other, by applying pressure; detecting a value and distribution of pressure applied to the element group, by the pressure detection film, at the time of the pressure bonding; and controlling pressure applied at the time of the pressure bonding, based on the detected pressure value and pressure distribution. "Pressure bonding" herein means attaching two or more objects to each other by applying pressure.

Another feature of a pressure bonding method of the present invention is to include the steps of: placing a substrate over a pressure detection film; placing an element group over the substrate selectively so that a first conductive film formed over the substrate and a second conductive film formed over the element group overlap each other; pressure-bonding the substrate and the element group so that the first conductive film formed over the substrate and the second conductive film formed over the element group are electrically connected to each other, by applying pressure; detecting, by the pressure detection film, a value and distribution of pressure applied to a region where the first conductive film formed over the substrate and the second conductive film formed over the element group are connected to each other and a region other than the connection region in the element group, at the time of the pressure bonding; and controlling pressure applied at the time of the pressure bonding, based on the detected pressure value and pressure distribution.

Another feature of a pressure bonding method of the present invention is to include the steps of: placing a substrate over a film that colors when pressure is applied thereto; placing an element group over the substrate selectively so that a first conductive film formed over the substrate and a second conductive film formed over the element group overlap each other; pressure-bonding the substrate and the element group so that the first conductive film formed over the substrate and the second conductive film formed over the element group are electrically connected to each other; detecting a value and distribution of pressure applied to the element group, by optically measuring a tone of a color of the film with an imaging device, at the time of the pressure bonding; and controlling pressure applied at the time of the pressure bonding, based on the detected pressure value and pressure distribution.

One feature of a pressure bonding apparatus of the present invention is to include: a supporting substrate; a pressure detection film provided over the supporting substrate; a pressing table; a pressure-applying means that applies pressure to the pressing table; and an imaging device provided below the supporting substrate. The pressure detection film is a film of which a portion, where pressure is applied, colors; and the imaging device optically measures a color generated in the pressure detection film so as to detect pressure distribution.

Another feature of a pressure bonding apparatus of the present invention is to include: a supporting substrate; a pressure detection film provided over the supporting substrate; a pressing table; a pressure-applying means that applies pressure to the pressing table; a controlling means that controls the pressure-applying means; and an imaging device provided below the supporting substrate. The pressure detection film is a film of which a portion, where pressure is applied, colors; and the controlling means detects a pressure value and distribution that are obtained by the imaging device that optically measures a color generated in the pressure detection film, so as to control the pressure-applying means, based on the detected pressure value and pressure distribution.

Another feature of a pressure bonding apparatus of the present invention is to include: a supporting substrate; a pressure detection film provided over the supporting substrate; a pressing table; a pressure-applying means that applies pressure to the pressing table; and a controlling means that controls the pressure-applying means. The controlling means detects a value and distribution of pressure applied to the pressure detection film, and controls the pressure-applying means based on the detected pressure value and pressure distribution.

One feature of a manufacturing method of a semiconductor device of the present invention is to include the steps of: forming a peeling layer over a first substrate; forming an element layer over the peeling layer, which includes an element formation layer including a transistor, a conductive film formed over the element formation layer so as to be electrically connected to the transistor, and a protective film formed so as to cover an edge portion of the conductive film; irradiating the element layer with laser light selectively and attaching a first sheet material to the element layer thereafter, and then peeling the element layer and the first sheet material from the first substrate; attaching a second sheet material to a surface of the element layer that is exposed by the peeling, and concurrently with or after that, peeling the first sheet material from the element layer; forming a conductive film functioning as a bump over the protective film so as to be electrically connected to the conductive film, so that an element group including the element layer, the conductive film functioning as a bump, and the second sheet material is formed; placing a second substrate over a pressure detection film; placing the element group selectively over the second substrate so that a conductive film functioning as an antenna formed over the second substrate and the conductive film functioning as a bump overlap each other; pressure-bonding the second substrate and the element group so that the conductive film formed over the second substrate and the conductive film functioning as a bump are electrically connected to each other; detecting a value and distribution of pressure applied to the element group, by the pressure detection film, at the time of the pressure bonding; and controlling pressure applied at the time of the pressure bonding, based on the detected pressure value and pressure distribution.

Another feature of a manufacturing method of a semiconductor device of the present invention is to include the steps of: forming a peeling layer over a first substrate; forming an element layer over the peeling layer, which includes an element formation layer including a transistor, a conductive film formed over the element formation layer so as to be electrically connected to the transistor, and a protective film formed so as to cover an edge portion of the conductive film; irradiating the element layer selectively with laser light and attaching a first sheet material to the element layer thereafter, and then peeling the element layer and the first sheet material from the first substrate; attaching a second sheet material to a surface of the element layer that is exposed by the peeling, and concurrently with or after that, peeling the first sheet material from the element layer; forming a conductive film functioning as a bump over the protective film so as to be electrically connected to the conductive film, so that an element group including the element layer, the conductive film functioning as a bump, and the second sheet material is formed; placing a second substrate over a film that colors when pressure is applied; placing the element group selectively over the second substrate so that a conductive film functioning as an antenna formed over the second substrate and the conductive film functioning as a bump overlap each other; pressure-bonding the second substrate and the element group so that the conductive film formed over the second substrate and the conductive film functioning as a bump are electrically connected to each other; detecting a value and distribution of pressure applied to the element group, by optically measuring a tone of a color of the film by an imaging device, at the time of the pressure bonding; and controlling pressure applied at the time of the pressure bonding, based on the detected pressure value and pressure distribution.

When a substrate and an element group are pressure-bonded to each other, by performing the pressure bonding while monitoring a value and distribution of pressure applied to the element group and controlling the pressure applied at the time of the pressure bonding, the substrate and the element group can be sufficiently connected, excessive pressure is prevented from being applied to the element group, and damage to an element such as a transistor included in the element group can be prevented.

BRIEF DESCRIPTION OF THE DRAWINGS

FIGS. 7A to 7C are views showing an example of a manufacturing method of a semiconductor device of the present invention.

FIGS. 10A and 10B are views showing an example of a manufacturing method of a semiconductor device of the present invention.

DETAILED DESCRIPTION OF THE INVENTION

Figure 1A:
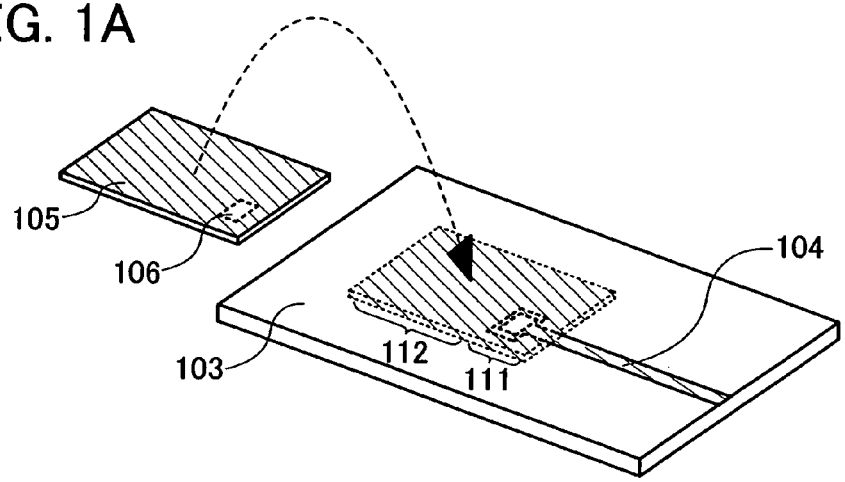
FIGS. 1A and 1B are views showing an example of a pressure bonding apparatus of the present invention.

Embodiment modes of the present invention will be described hereinafter with reference to the drawings. However, the present invention is not limited to the description below, and it is easily understood by those skilled in the art that the modes and details can be changed in various ways without departing from the spirit and scope of the present invention. Therefore, the present invention is not interpreted as being limited to the following description of the embodiment modes. In the structure of the present invention described below, the same reference numerals denoting the same objects may be used in common in different drawings.

Embodiment Mode 1

In this embodiment mode, an example of a pressure bonding apparatus and a pressure bonding method of the present invention will be described with reference to drawings. Specifically, the explanation will be made on a case where an element group is provided over a substrate by pressure bonding.

FIG. 1A shows a case where a conductive film 104 formed over a substrate 103 and an element group 105 are electrically connected to each other by pressure-bonding the element group 105 to the substrate 103. More specifically, FIG. 1A shows a case where the conductive film 104 formed over the substrate 103 and a conductive film 106 functioning as a bump formed over the element group 105 are pressure-bonded to each other via a material with adhesiveness such as an anisotropic conductive film (ACF) or an anisotropic conductive paste (ACP) so as to be electrically connected to each other. It is to be noted that "pressure bonding" herein means attaching two or more objects to each other by applying pressure. Heat may be applied when applying pressure.

Figure 1B:
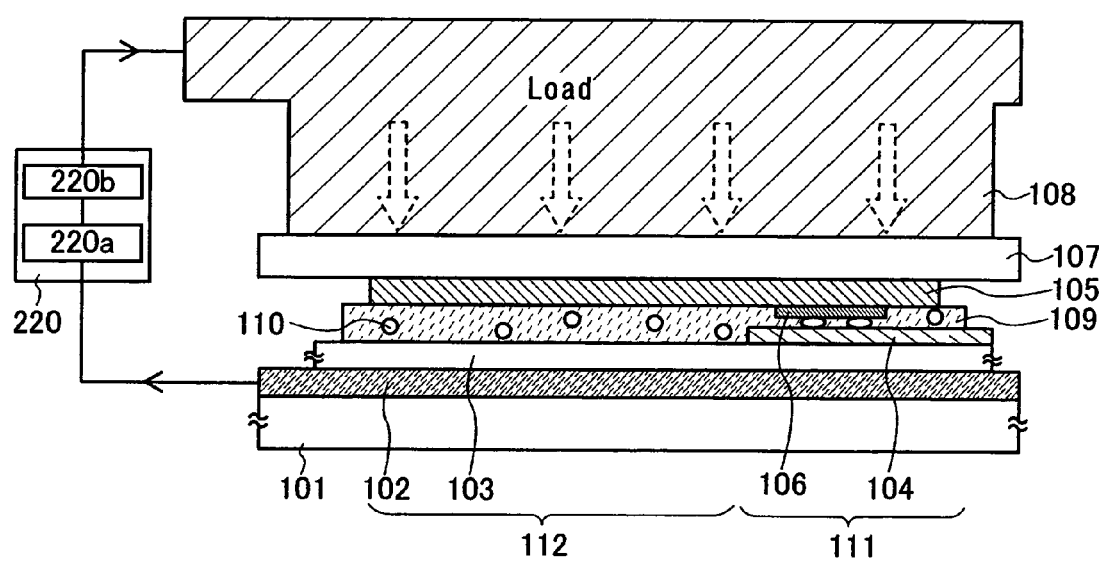

The pressure bonding apparatus described in this embodiment mode includes at least a supporting substrate 101, a pressure detection film 102, a pressing table 107, and a pressure-applying means 108 (FIG. 1B). Here, the pressure detection film 102 is provided over the supporting substrate 101, and objects to be pressured-bonded to each other (here, the substrate 103 and the element group 105) is placed between the pressure detection film 102 and the pressing table 107.

As the supporting substrate 101, a glass substrate, a plastic substrate, a metal substrate, or the like can be used. When there is a problem in flatness, a substrate formed of silicon rubber is preferably used. Of course, silicon rubber may be provided over a substrate such as a glass substrate or a metal substrate.

The pressure detection film 102 is acceptable as long as a means for detecting pressure is included. Preferably, the pressure detection film can minutely detect pressure applied to objects to be pressure-bonded to each other placed thereover. For example, a sheet on which a pressure sensor is provided or the like can be used.

The pressing table 107 is acceptable as long as it can apply pressure uniformly to the objects to be pressure-bonded to each other, and silicon rubber can be used, for example.

The pressure-applying means 108 is acceptable as long as it has a means for applying pressure to the pressing table 107. In a case where heating is performed concurrently with pressure bonding, the pressure-applying means 108 may include a heating means.

Next, a method for pressure-bonding a substrate and an element group to each other by using the above-described pressure bonding apparatus will be described hereinafter.

First, the substrate 103 and the element group 105 as the objects to be pressure-bonded to each other are placed between the pressure detection film 102 and the pressing table 107. Here, the substrate 103 is placed over the pressure detection film 102, and the element group 105 is placed so as to selectively overlap the substrate 103. Specifically, the substrate 103 and the element group 105 are placed so that the conductive film 104 formed over the substrate 103 and the conductive film 106 functioning as a bump formed over the element group 105 overlap each other.

Subsequently, the substrate 103 and the element group 105 are pressure-bonded to each other by using the pressing table 107; thereby electrically connecting the conductive film 104 formed over the substrate 103 and the conductive film 106 functioning as a bump formed over the element group 105. By using the material with adhesiveness such as the anisotropic conductive film (ACF) or the anisotropic conductive paste (ACP) in pressure bonding, the substrate 103 and the element group 105 are bonded to each other, and the conductive film 104 and the conductive film 106 functioning as a bump can be electrically connected to each other.

Here, a case of using the anisotropic conductive film for pressure bonding of the substrate 103 and the element group 105 (the conductive film 104 and the conductive film 106 functioning as a bump) is shown, and the substrate 103 and the element group 105 are bonded to each other using a resin 109 having adhesiveness. In addition, a conductive particle 110 contained in the resin 109 is used for electrically connecting the conductive film 104 and the conductive film 106 functioning as a bump. It is to be noted that a heat treatment is preferably performed concurrently with pressure bonding in a case where the anisotropic conductive film or the anisotropic conductive paste is used for the pressure bonding. In this case, the supporting substrate 101 may include a heating means, or the pressing table 107 or the pressure-applying means 108 may include a heating means. Furthermore, a conductive adhesive such as a silver paste, a copper paste, or a carbon paste; solder joint; or the like may be used for the pressure bonding of the substrate 103 and the element group 105.

In this embodiment mode, the pressure detection film 102 detects a value and distribution of the pressure applied to the element group 105 in pressure bonding, and the pressure bonding is conducted while controlling the pressure to be applied to the substrate 103 and the element group 105 (the conductive film 104 and the conductive film 106 functioning as a bump) in real time, based on the detection result. Specifically, the pressure bonding is conducted while controlling the pressure to be applied from the pressure-applying means 108 to the objects to be pressure-bonded to each other (here, the element group 105 and the substrate 103) through the pressing table 107 at the time of the pressure bonding. That is, the pressure to be applied at the time of the pressure bonding is adjusted while monitoring the value and distribution of the pressure applied to the element group 105 in pressure bonding. Monitoring of the pressure value and pressure distribution, or adjustment of the value of the pressure to be applied can be performed using a controlling means 220 constituted by a computer or the like.

Specifically, the value and distribution of the pressure applied to the element group 105 are measured using the pressure detection film 102, and the measured pressure value, pressure distribution, or the like is detected as an electric signal or the like in a detection part 220a included in the controlling means 220. Data of the electric signal of the detected pressure value, pressure distribution, or the like is compared to data which is input beforehand to be a reference. Based on the result, a controlling part 220b included in the controlling means 220 immediately transmits an instruction to the pressure-applying means 108, so that the value of the pressure to be applied to the element group 105 is controlled. For example, in a case where excessive pressure is found to be applied to the element group 105 when the detected data is compared to the data as the reference, the controlling part 220b transmits an instruction for stopping additional pressure to the pressure-applying means 108. On the other hand, in a case where pressure applied to the element group 105 is found to be not enough when the detected data is compared to the data as the reference, the controlling part 220*b* transmits an instruction for applying additional pressure to the pressure-applying means 108.

Generally, when the substrate 103 and the element group 105 (the conductive film 104 and the conductive film 106 functioning as a bump) are pressure-bonded, more pressure is locally applied to a region in which connection is directly performed (here, a portion where the conductive film 106 is formed) (hereinafter referred to as a region 111) than to the other region (hereinafter referred to as a region 112) in the element group 105, because regions where conductive films such as the conductive film 106 and the conductive film 104 are located are more elevated than surrounding regions of the element group 105 and the substrate 103. Therefore, an element such as a transistor included in the element group 105 is formed in the region 112, avoiding the region 111 where the connection is directly performed.

In the present invention, the pressure applied in pressure-bonding the substrate 103 and the element group 105 to each other is controlled based on detection results of a pressure value and pressure distribution in at least two regions in the element group 105. This is because, it is preferable that pressure bonding be performed by applying sufficient pressure in the region 111 where the connection is directly performed, and in a case where the pressure is not sufficient, a problem such as a connection failure occurs between the conductive film 106 functioning as a bump and the conductive film 104. On the other hand, in the region 112 where an element such as a transistor is formed, the less pressure is applied, the more preferable, because damage to the transistor or the like can be prevented. In this way, the pressure applied at the time of the pressure bonding should not be too high or too low, and there exists a trade-off relation.

Accordingly, in the present invention, pressure is applied at the time of pressure bonding while monitoring a pressure value and pressure distribution in at least two regions (here, the region 111 and the region 112) in the element group 105. Specifically, the pressure value required for electrical connection between the conductive film 106 functioning as a bump and the conductive film 104 is set to be P1, and the pressure value which damages an element such as a transistor is set to be P2 (P1 and P2 are obtained beforehand). Pressure bonding is performed so that pressure P111 in the region 111 satisfies P111>P1, and pressure P112 in the region 112 satisfies P112<P2.

The above-described pressure bonding method is effective particularly in a case where the element group 105 has flexibility. This is because, in a case where an element such as a transistor is formed over a flexible substrate such as plastic, pressure is applied more easily to the transistor and a possibility that the transistor is damaged is larger, as compared to the case where a transistor is formed over a glass substrate or a semiconductor substrate such as silicon.

Furthermore, in a case where a heat treatment is performed in pressure bonding, pressure applied to the element group 105 changes depending on a temperature of the heat treatment even when the same pressure is applied to objects to be pressure-bonded to each other, via the pressing table 107. In addition, as the temperature changes, pressure applied to the element group 105 changes depending on a material used for the element group 105. Therefore, controlling the pressure applied at the time of the pressure bonding while monitoring is very effective.

As described above, when a substrate and an element group are pressure-bonded to each other, by controlling pressure applied at the time of the pressure bonding in real time while monitoring a value and distribution of the pressure applied to the element group, the substrate and the element group can be sufficiently connected to each other, excessive pressure is prevented from being applied to the element group, and damage to an element such as a transistor included in the element group can be prevented.

Embodiment Mode 2

In this embodiment mode, a different structure of a pressure bonding apparatus from the one explained in the above embodiment mode will be described with reference to drawings.

Figure 2A:
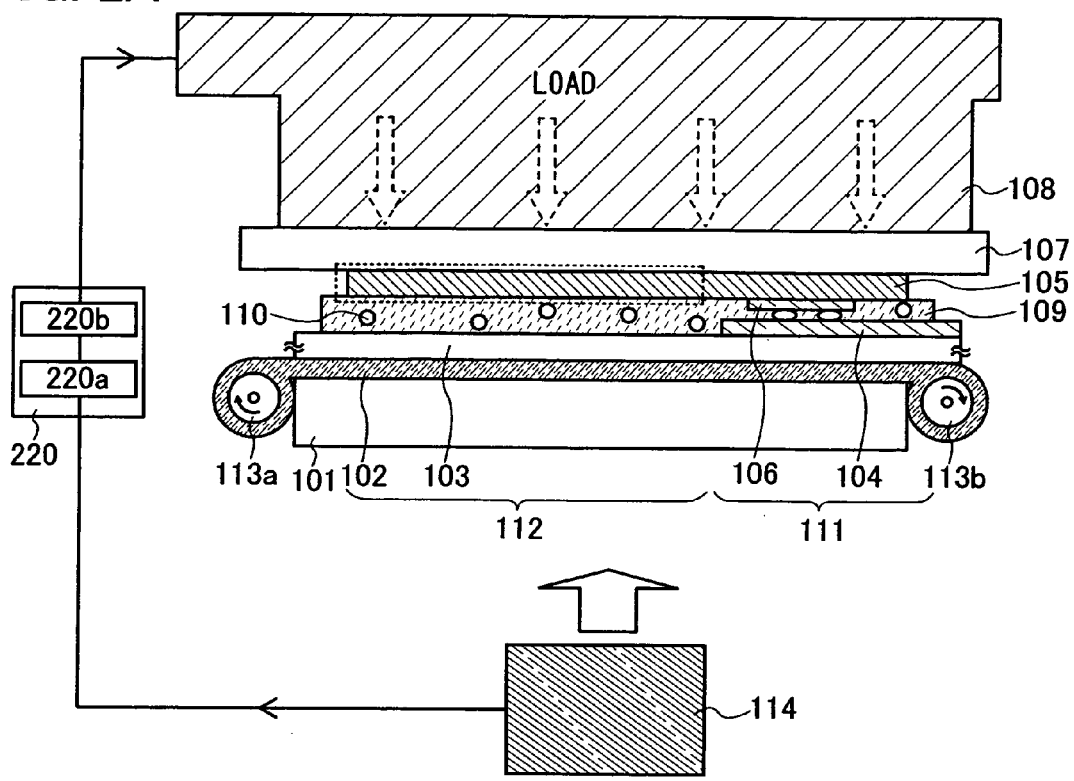
FIGS. 2A and 2B are views showing an example of a pressure bonding apparatus of the present invention.
Figure 2B:
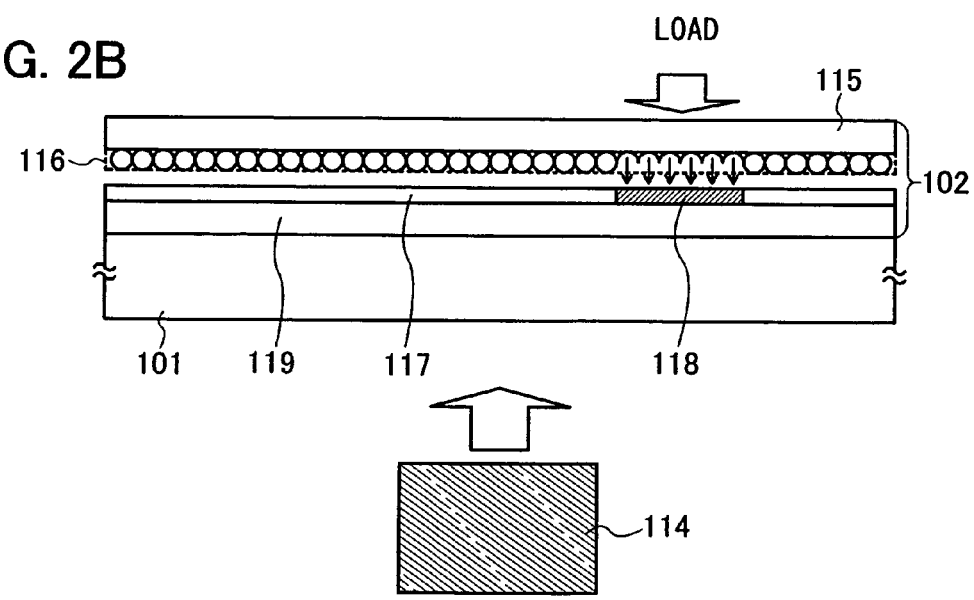

An example structure of a pressure bonding apparatus described in this embodiment mode is shown in FIGS. 2A and 2B. The pressure bonding apparatus shown in FIG. 2A includes at least a supporting substrate 101, a pressure detection film 102, a pressing table 107, a pressure-applying means 108, and an imaging device 114. Here, the pressure detection film 102 is provided over the supporting substrate 101, and a substrate 103 is placed over the pressure detection film 102. Then, in order to electrically connect a conductive film 104 formed over the substrate 103 to an element group 105, the substrate 103 and the element group 105 are pressure-bonded. Specifically, the substrate 103 and the element group 105 are attached to each other so that the conductive film 104 formed over the substrate 103 and a conductive film 106 functioning as a bump formed over the element group 105 are electrically connected to each other.

It is to be noted that, in the pressure bonding apparatus in FIG. 2A, a film in which a visual change (color change) occurs in a portion where pressure is applied is used as the pressure detection film. For example, a pressure-sensitive film, of which a portion where pressure is applied colors so that a value and distribution of pressure applied at the time of the pressure bonding can be obtained by a tone (density) of the color, can be used.

As the pressure-sensitive film, a film shown in FIG. 2B can be given as an example, film which includes a coloring agent layer 116 and a developer layer 117, and when a capsule included in the coloring agent layer 116 is destroyed by pressure, a color former inside adsorbs to the developer, and a color is formed by chemical reaction. As for the pressure-sensitive film shown here, the coloring agent layer 116 is formed over a base film 115, the developer layer 117 is formed over a base film 119, and the base film 115 and the base film 119 are overlapped with each other for use. Then, the color former, which is included in the coloring agent layer in a region where pressure is selectively applied, adsorbs to the developer in the developer layer in that region, so that a coloring portion 118 is generated. It is to be noted that the pressure-sensitive film is not limited to the structure shown in FIG. 2B, and the pressure-sensitive film is acceptable as long as a portion thereof where pressure is applied selectively colors, and a film formed by directly placing a coloring agent layer over a developer layer formed over a base film may also be used.

In the pressure bonding apparatus shown in FIG. 2A, by optically measuring a tone of the color formed in the above-described pressure-sensitive film by the imaging device 114, a pressure value and pressure distribution at the time of the pressure bonding can be detected in real time. It is to be noted that "optically measuring" here means that the measurement is conducted by using characteristics of light (for example, a wavelength of light, or the like). As the imaging device 114, a CCD camera can be typically given. Alternatively, a tone of the pressure-sensitive film caused by a pressure value and pressure distribution can be detected by irradiating the pressure-sensitive film with light and measuring the reflective light and transmitted light.

In the pressure bonding apparatus in FIG. 2A, the supporting substrate 101 preferably has a light-transmitting property so that the color generated in the pressure detection film 102 is optically measured by using the imaging device 114. A glass substrate, a plastic substrate, or the like having a light-transmitting property can be used as the supporting substrate 101.

In addition, in a case where a film which cannot be reused is used as the pressure detection film, it is preferable that a structure in which a new part of pressure-sensitive film is always supplied at the time of pressure bonding by using rollers 113a and 113b be employed, so that the productivity is improved. Specifically, a new part of pressure-sensitive film before use is wrapped around the roller 113a, and a part of the pressure-sensitive film after use is reeled by the roller 113b, so that the production efficiency can be improved.

Next, a method for pressure-bonding a substrate and an element group by using the pressure bonding apparatus shown in FIG. 2A will be described hereinafter.

First, the substrate 103 and the element group 105 as objects to be pressure-bonded to each other are placed between the pressure detection film 102 formed of a pressure-sensitive film and the pressing table 107. Here, the substrate 103 is placed over the pressure detection film 102, and the element group 105 is selectively placed overlapping the substrate 103. Specifically, the substrate 103 and the element group 105 are placed so that the conductive film 104 formed over the substrate 103 and the conductive film 106 functioning as a bump formed over the element group 105 overlap each other. It is to be noted that the pressure detection film moves in a direction from the roller 113a toward the roller 113b so that a new part of the pressure detection film is supplied before the substrate 103 is placed.

Subsequently, the substrate 103 and the element group 105 are pressure-bonded to each other by the pressing table 107, so that the conductive film 104 formed over the substrate 103 and the conductive film 106 functioning as a bump formed over the element group 105 are electrically connected to each other. By using an adhesive with conductivity such as an anisotropic conductive film (ACF) or an anisotropic conductive paste (ACP) in pressure bonding, the substrate 103 and the element group 105 are bonded to each other, and the conductive film 104 and the conductive film 106 functioning as a bump can be electrically connected to each other.

Here, a case where the anisotropic conductive film is used for attaching the substrate 103 and the element group 105 (the conductive film 104 and the conductive film 106 functioning as a bump) to each other is shown, and a resin 109 having adhesiveness is used for bonding the substrate 103 and the element group 105 to each other. In addition, the conductive film 104 and the conductive film 106 functioning as a bump are electrically connected to each other using a conductive particle 110 contained in the resin 109. In a case where the anisotropic conductive film or the anisotropic conductive paste is used for pressure bonding, a heat treatment is preferably performed concurrently with the pressure bonding. Furthermore, a conductive adhesive such as a silver paste, a copper paste, or a carbon paste; solder joint; or the like can be used for the attaching of the substrate 103 and the element group 105.

In addition, the pressure detection film 102 which colors when pressure is applied at the time of the pressure bonding is optically measured by the imaging device 114 placed below the supporting substrate 101, and a value and distribution of pressure applied to the element group 105 are detected so that the pressure applied by the pressure-applying means 108 at the time of the pressure bonding is controlled in real time. That is, the pressure to be applied to the element group 105 is controlled while monitoring the pressure value and pressure distribution detected by using the imaging device 114 in pressure bonding. The monitoring of the pressure value and pressure distribution, or the adjustment of the value of the pressure to be applied can be performed by using a controlling means 220 constituted by a computer or the like. Specifically, a tone change generated in the pressure detection film 102 is optically measured by using the imaging device 114, and the tone change depending on the pressure value, pressure distribution or the like measured by the imaging device 114 is detected as an electric signal or the like in the detection part 220a included in the controlling means 220. Then, based on a result detected in the controlling part 220b included in the controlling means 220, an instruction is immediately sent from the controlling means 220 to the pressure-applying means 108 so that the value of the pressure to be applied to the element group 105 or the like is controlled.

Furthermore, as described in the above embodiment mode, pressure is applied in pressure bonding, while monitoring a value and distribution of pressure applied to at least two regions (here, a region 111 and a region 112) in the element group 105. Specifically, the pressure value required for electrical connection between the conductive film 106 functioning as a bump and the conductive film 104 is set to be P1, and the pressure value which damages an element such as a transistor is set to be P2 (P1 and P2 are obtained beforehand). Pressure bonding is performed so that pressure P111 in the region 111 satisfies P111>P1 and pressure P112 in the region 112 satisfies P112<P2 in pressure bonding. By performing the pressure bonding of the substrate and the element group in this way, the substrate and the element group can be sufficiently connected, excessive pressure is prevented from being applied to the element group, and damage to an element such as a transistor included in the element group can be prevented.

Embodiment Mode 3

In this embodiment mode, a different structure of a pressure bonding apparatus from the one explained in the above embodiment mode will be described with reference to drawings.

In the pressure bonding apparatus described in the above embodiment mode, an example of using a pressure-sensitive film as the pressure detection film is shown. However, the pressure detection film is acceptable as long as pressure applied to the element group which is placed above the pressure detection film can be detected.

Figure 3A:
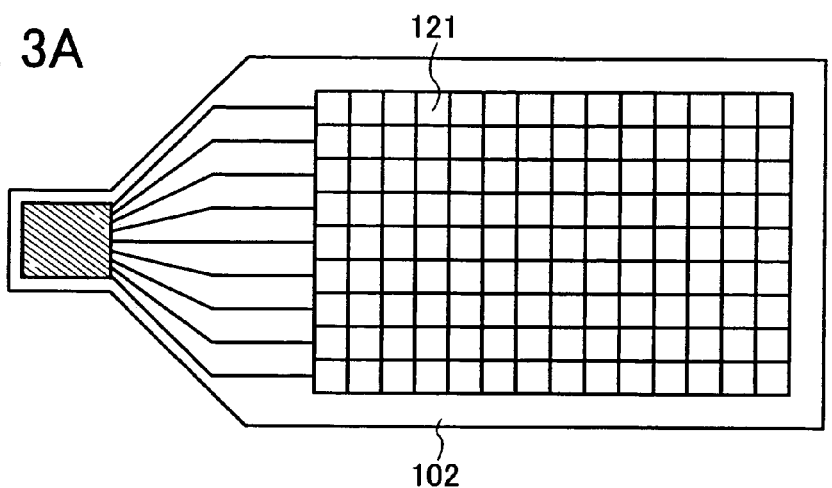
FIGS. 3A and 3B are views showing an example of a pressure bonding apparatus of the present invention.

As the pressure detection film 102 in FIG. 1B, a pressure sensor in which pressure-sensitive elements 121 which can detect a change in pressure are arranged in a matrix can be used (FIG. 3A). For example, by using pressure-sensitive elements which can convert a change in pressure into an electric signal, arranged in a matrix, a value and distribution of pressure applied to the element group when pressure-bonding the substrate and the element group can be detected.

As the pressure sensor, for example, a silicon diaphragm system that detects a change in pressure by using a change in a resistance value of a strain resistor, which is formed on a silicon chip, can be used. The change in the resistance value of the strain resistor is caused by the silicon chip which is strained by pressure applied thereto.

In addition, a structure in which pressure-sensitive conductive rubber is interposed between electrodes arranged in a matrix may be used as the pressure sensor. The pressure-sensitive conductive rubber is formed by mixing a conductive material (conductive particles, for example) into an insulating rubber material so that the conductive particles are uniformly dispersed in the insulating rubber material. When pressure is not applied, the conductive particles dispersed in the rubber material do not contact with each other, so that they show a very high resistance value. On the other hand, when pressure is applied, the conductive particles dispersed in the rubber material gradually start contacting with each other, and electric resistance changes as the rubber is strained by a change in pressure. The electrode detects this electric resistance; thereby detecting a value and distribution of pressure applied to the element group when pressure-bonding the substrate and the element group. By using the pressure sensor with such a structure, pressure-sensitive elements are not required to be arranged in a matrix, so that pressure distribution in the element group can be detected in more detail.

It is to be noted that, even in a case where the above-described pressure sensor is used as the pressure detection film, by controlling pressure applied at the time of the pressure bonding in real time while detecting a value and distribution of the pressure applied to the element group at the time of the pressure bonding, the substrate and the element group can be sufficiently connected to each other, excessive pressure is prevented from being applied to the element group, and damage to an element such as a transistor included in the element group can be prevented. Furthermore, since the above-described pressure sensor can measure the pressure repeatedly, the cost can be lowered compared to a case of using a disposable film.

Figure 3B:
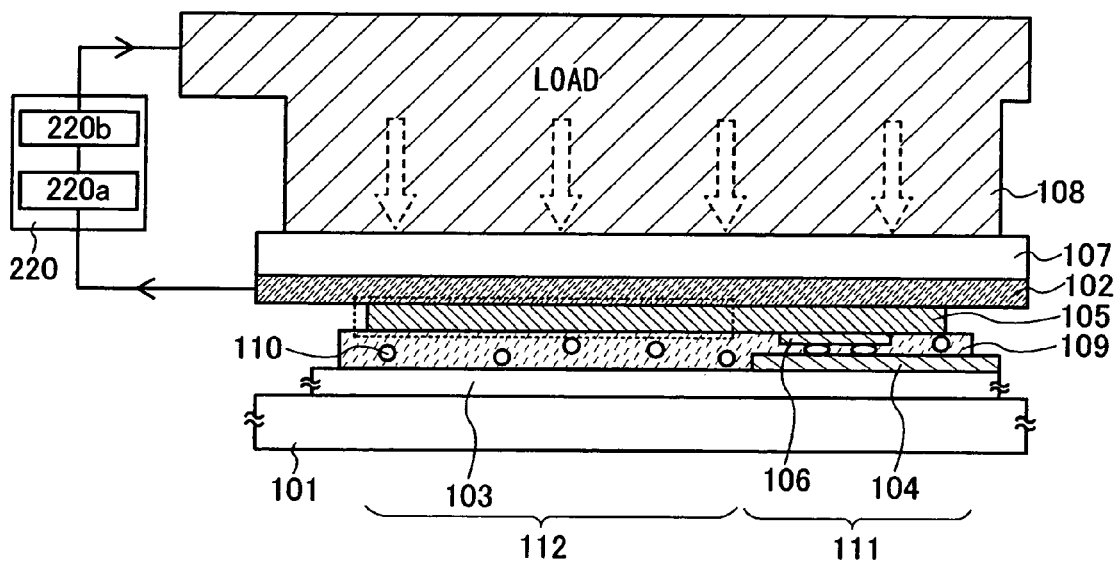

In addition, the pressure detection film 102 is provided over the supporting substrate 101 and objects to be pressure-bonded to each other are placed between the pressure detection film 102 and the pressing table 107 for performing pressure bonding in the above-described pressure bonding apparatus. However, the pressure detection film 102 may be placed so as to be in contact with the pressing table 107, and the objects to be pressure-bonded to each other may be placed between the supporting substrate 101 and the pressure detection film 102 for performing pressure bonding (FIG. 3B). In a case of such a structure, the pressure detection film 102 is in contact with the element group 105, so that a value and distribution of pressure applied to the element group 105 can be measured more accurately.

It is to be noted that this embodiment mode can be carried out freely combining with the above-described embodiment modes.

Embodiment Mode 4

In this embodiment mode, a case where an element group including an element such as a transistor is attached to a conductive film functioning as an antenna formed over a substrate will be described with reference to drawings.

Figure 4A:
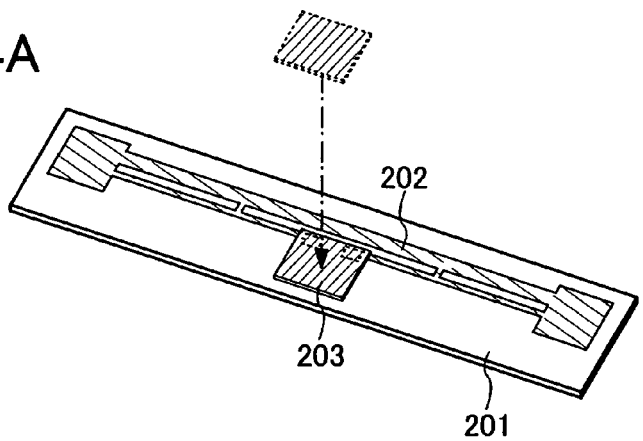
FIGS. 4A to 4C are views showing an example of a pressure bonding apparatus of the present invention.
Figure 4B:
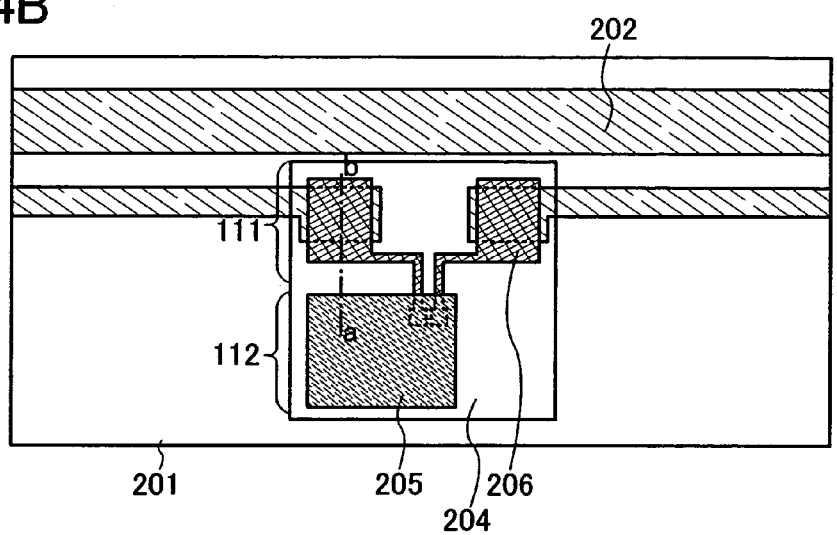
Figure 4C:
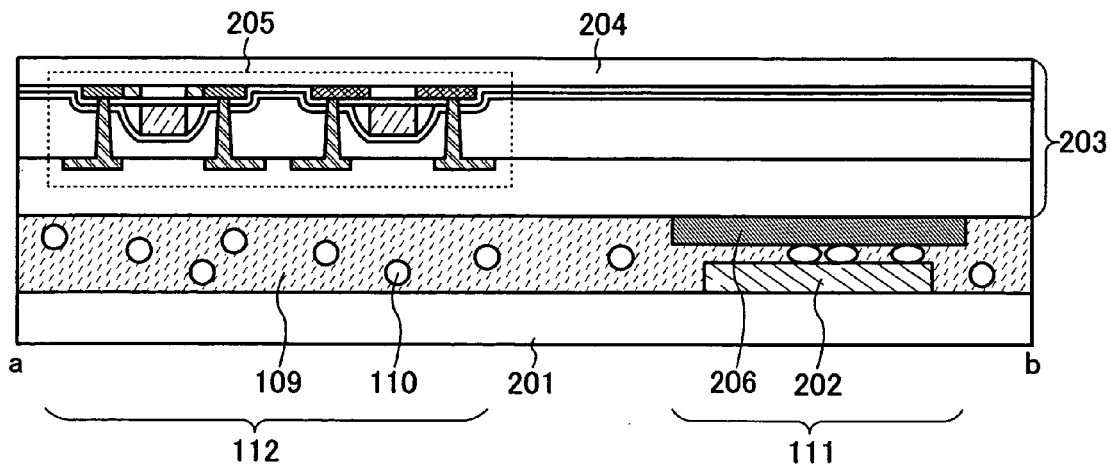

To start with, a case where an element group 203 having flexibility is provided over a substrate 201 with a conductive film 202 functioning as an antenna formed thereover, by pressure bonding, will be described (FIGS. 4A to 4C).

First, the conductive film 202 functioning as an antenna is formed over the substrate 201, and the element group 203 is formed separately. A shape and the like of the conductive film 202 functioning as an antenna may be arbitrarily decided by a practitioner considering a communication method and a communication range. In addition, here, two connecting terminals for electrical connection with the element group are included in the conductive film 202. The element group 203 includes an element formation layer 205 including a thin film transistor or the like formed over a flexible substrate 204, and a conductive film 206 functioning as a bump which is electrically connected to the element formation layer 205.

Next, pressure bonding of the substrate 201 and the element group 203 using the pressure bonding apparatus described in the above embodiment mode will be described.

Figure 14A:
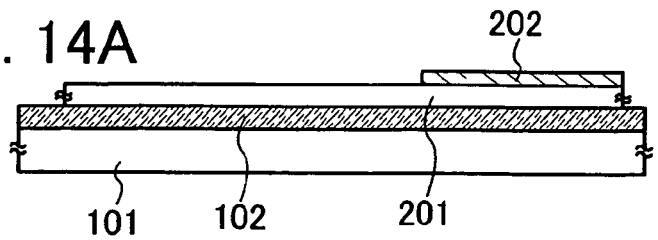
FIGS. 14A to 14D are views showing an example of a pressure bonding method of the present invention.
Figure 14B:
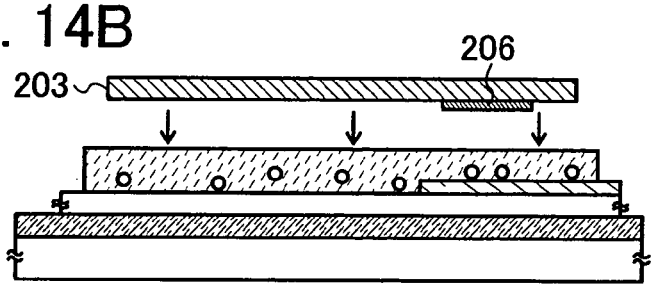

The substrate 201 with the conductive film 202 formed thereover is placed over a supporting substrate 101 via a pressure detection film 102 (FIG. 14A), and the element group 203 is placed so that the conductive film 206 functioning as a bump overlaps the connecting terminal included in the conductive film 202. It is to be noted that an adhesive material such as an anisotropic conductive film (ACF) or an anisotropic conductive paste (ACP) is interposed between the substrate 201 and the element group 203 at this time (FIG. 14B).

Figure 14C:
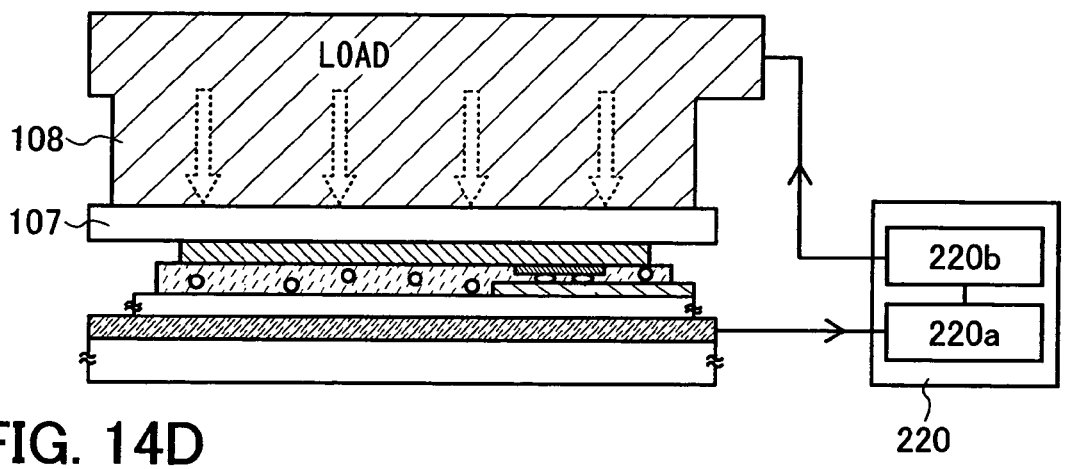

Subsequently, the substrate 201 and the element group 203 are sandwiched between the supporting substrate 101 and the pressing table 107, and pressure is gradually applied thereto by using a pressure-applying means 108 (FIG. 14C). The pressure applied by the pressure-applying means 108 is controlled by a controlling means 220 constituted by a computer or the like. In addition, a heat treatment is also performed concurrently with applying pressure, here.

When pressure is applied to the element group 203 and the like, a value and distribution of the pressure applied to the element group 203 are measured by using a pressure detection film, and the measured pressure value, pressure distribution and the like are detected by a detection part 220a included in the controlling means 220. Then, based on a result detected by the detection part 220a, an instruction is immediately sent from a controlling part 220b included in the controlling means 220 to the pressure-applying means 108; thereby controlling the value of the pressure applied to the element group 203 and the like.

Figure 14D:
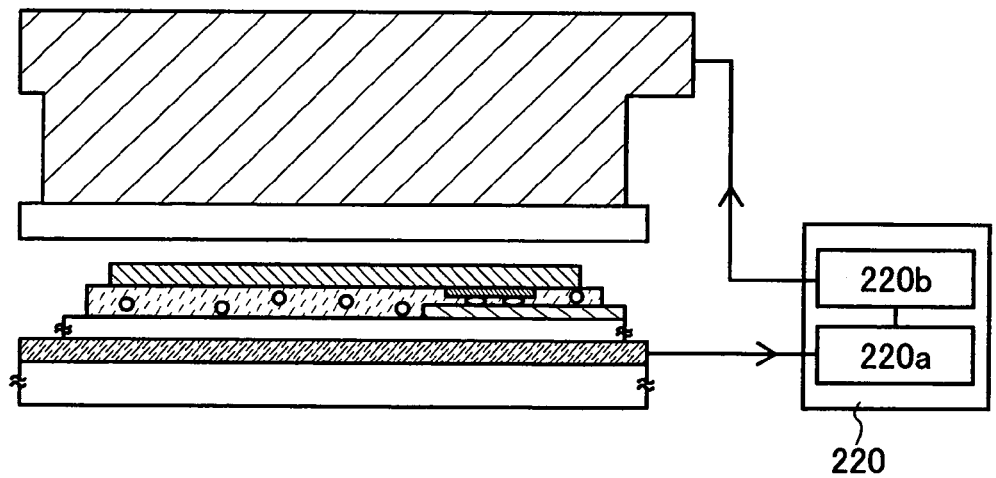

Specifically, here, the pressure to be applied to the element group 203 and the like is continuously controlled, while monitoring a pressure value and pressure distribution in a region 111 where the connecting terminal of the conductive film 202 and the conductive film 206 functioning as a bump are connected to each other and in a region 112 including the element formation layer 205. In particular, when pressure higher than a certain level (pressure which damages a transistor) is likely to be applied to the region 112 including the element formation layer 205, additional pressure is prevented from being applied (FIG. 14D). In addition, in a case where the pressure applied to the region 111 at this time does not reach the pressure for connecting the conductive film 202 and the conductive film 206 functioning as a bump, there is a possibility of a connection failure, so it is preferable that the objects to be pressure-bonded to each other be taken out the process and checked.

By performing the pressure bonding in this way, the substrate and the element group can be sufficiently connected to each other, excessive pressure is prevented from being applied to the element group, and damage to an element such as a transistor included in the element group can be prevented.

Figure 5A:
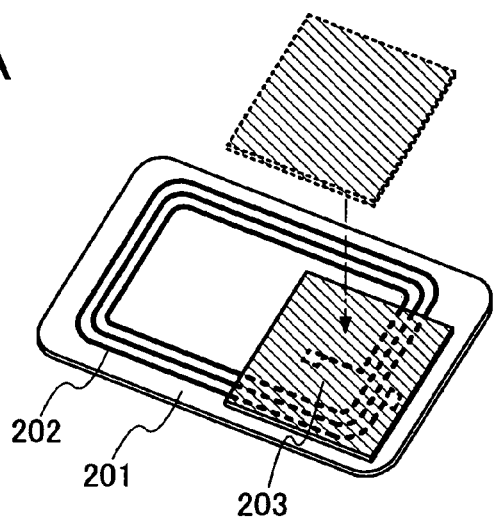
FIGS. 5A to 5C are views showing an example of a pressure bonding apparatus of the present invention.
Figure 5B:
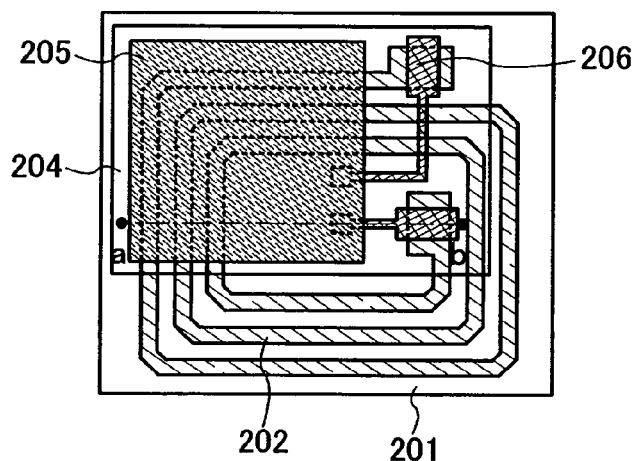
Figure 5C:
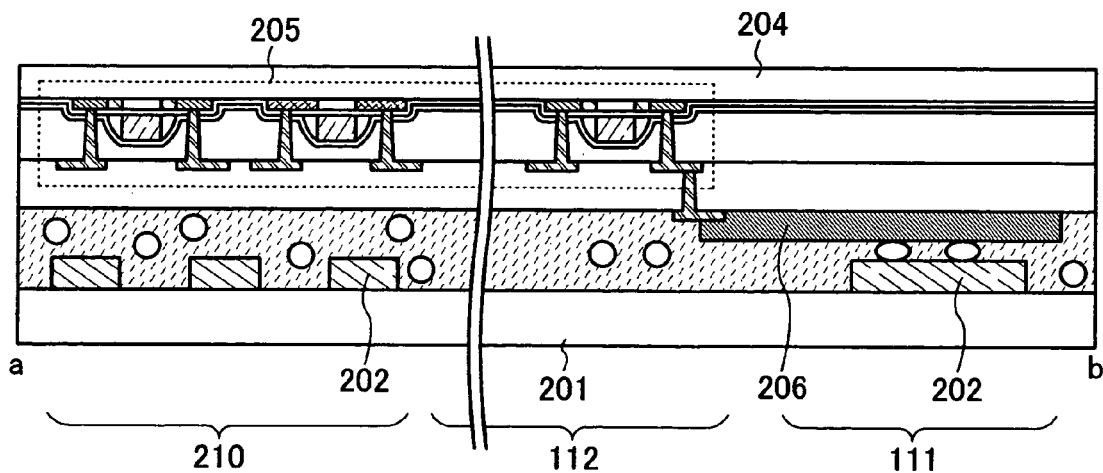

Next, a case where the element group 203 is provided so as to cover a part of the conductive film 202 functioning as an antenna formed over the substrate, by pressure bonding, will be described with reference to FIGS. 5A to 5C.

In this case, there is a possibility that more pressure is locally applied to a region 210 where the conductive film 202 functioning as an antenna and the element formation layer 205 including a transistor and the like overlap each other, compared to the region 112 without such overlapping. Therefore, in the case where the element formation layer 205 is placed so as to cover the conductive film 202 functioning as an antenna, it is preferable that pressure to be applied to the element group 203 be controlled while monitoring a pressure value and pressure distribution in the following three regions by the controlling means 220: the region 111 where the connecting terminal of the conductive film 202 and the conductive film 206 functioning as a bump are connected to each other; the region 112 which includes the element formation layer 205 but does not overlap the conductive film 206; and the region 210 which includes the element formation layer 205 and overlaps the conductive film 202.

Specifically, when pressure higher than a certain level (pressure which damages a transistor) is likely to be applied to the region 210 including the element formation layer 205 and overlapping the conductive film 202, additional pressure is prevented from being applied.

Specifically, the pressure value required for electrical connection between the conductive film 206 functioning as a bump and the connecting terminal of the conductive film 202 is set to be P1, and the pressure value which damages an element such as a transistor is set to be P2 (P1 and P2 are obtained beforehand). Pressure bonding is performed so that pressure P111 in the region 111 satisfies P111>P1, pressure P112 in the region 112 satisfies P112<P2, and pressure P210 in the region 210 satisfies P210<P2, in pressure bonding.

By performing pressure bonding in this way, even when an element group is provided so as to cover a conductive film functioning as an antenna formed over a substrate by pressure bonding, the substrate and the element group can be sufficiently connected to each other, excessive pressure is prevented from being applied to the element group, and damage to an element such as a transistor included in the element group can be prevented. Furthermore, by setting a minimum pressure value required for the connection beforehand, the objects to be pressure-bonded to each other can be checked separately in a case where the pressure does not reach the minimum pressure value, so that the reliability can be improved.

Embodiment Mode 5

In this embodiment mode, a manufacturing method of a semiconductor device, using a pressure bonding apparatus and a pressure bonding method, will be described with reference to drawings. Specifically, a case where an element such as a transistor is formed over a flexible substrate so as to form an element group, and then the element group is provided over a substrate by pressure bonding will be described.

Figure 6A:
FIGS. 6A to 6D are views showing an example of a manufacturing method of a semiconductor device of the present invention.

First, a peeling layer 702 is formed over a surface of a substrate 701, and sequentially, an insulating film 703 to be a base and an amorphous semiconductor film 704 (a film containing amorphous silicon, for example) are formed (FIG. 6A). It is to be noted that the peeling layer 702, the insulating film 703, and the amorphous semiconductor film 704 can be formed sequentially.

As the substrate 701, a glass substrate, a quartz substrate, a metal substrate, or a stainless steel substrate, with an insulating film formed over a surface thereof, a plastic substrate having heat resistance against the treatment temperature of this step, or the like may be used. With such a substrate 701, an area and a shape thereof are not particularly restricted; therefore, by using a rectangular substrate with at least one meter on a side as the substrate 701, for example, the productivity can be drastically improved. Such merit is greatly advantageous as compared to a case of using a round silicon substrate. It is to be noted that, the peeling layer 702 is formed over an entire surface of the substrate 701 in this step; however, the peeling layer 702 may be selectively formed as needed using a photolithography method after the peeling layer is formed over the entire surface of the substrate 701. In addition, the peeling layer 702 is formed so as to be in contact with the substrate 701; however, an insulating film may be formed as a base film to be in contact with the substrate 701 as needed, and the peeling layer 702 may be formed so as to be in contact with the insulating film.

As the peeling layer 702, a metal film, a stacked layer structure of a metal film and a metal oxide film, or the like may be used. The metal film is formed as a single layer or a stacked layer of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing the above-described element as its main component. The film can be formed by a sputtering method, various CVD methods such as a plasma CVD method or the like, using these materials. As the stacked layer structure of a metal film and a metal oxide film, after the above-described metal film is formed, an oxide or oxynitride of the metal film can be formed on the metal film surface by performing a plasma treatment in an oxygen atmosphere or an $N_2O$ atmosphere, or a heat treatment in an oxygen atmosphere or an $N_2O$ atmosphere. For example, in a case where a tungsten film is formed by a sputtering method, a CVD method or the like as the metal film, a metal oxide film of tungsten oxide can be formed on the tungsten film surface by performing a plasma treatment on the tungsten film. In this case, an oxide of tungsten is expressed in $WO_x$, and x is 2 to 3. There are cases of x=2 ($WO_2$), x=2.5 ($W_2O_5$), x=2.75 ($W_4O_{11}$), x=3 ($WO_3$), and the like. When forming an oxide of tungsten, the values of x described above are not particularly restricted, and which oxide is to be formed may be decided based on an etching rate or the like. Alternatively, for example, a metal film (such as tungsten) is formed and then an insulating film such as silicon oxide ($SiO_2$) is formed over the metal film by a sputtering method, and a metal oxide may be further formed thereover (for example, tungsten oxide over tungsten). In addition, as a plasma treatment, a high-density plasma treatment may be used.

As the insulating film 703, a single layer or a stacked layer of a film containing an oxide of silicon or a nitride of silicon is formed by a sputtering method, a plasma CVD method or the like. In a case where the base insulating film employs a two-layer structure, a silicon nitride oxide film may be formed as a first layer, and a silicon oxynitride film may be formed as a second layer, for example. In a case where the base insulating film employs a three-layer structure, a silicon oxide film, a silicon nitride oxide film, and a silicon oxynitride film may be formed as a first insulating film, a second insulating film, and a third insulating film, respectively. Alternatively, a silicon oxynitride film, a silicon nitride oxide film, and a silicon oxynitride film may be formed as a first insulating film, a second insulating film, and a third insulating film, respectively. The base insulating film functions as a blocking film for preventing the entry of an impurity from the substrate 701.

The semiconductor film 704 is formed with a thickness of 25 to 200 nm (preferably 30 to 150 nm), by a sputtering method, an LPCVD method, a plasma CVD method or the like.

Figure 6B:
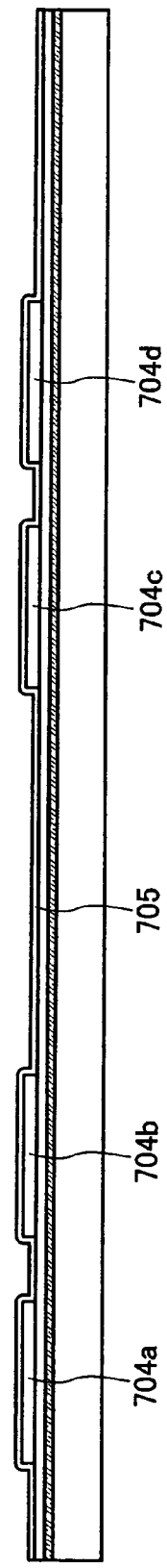

Next, the amorphous semiconductor film 704 is crystallized by a known crystallization method (a laser crystallization method, a thermal crystallization method using an RTA or an annealing furnace, a thermal crystallization method using a metal element for promoting crystallization, a method in which the laser crystallization method is combined with the thermal crystallization method using a metal element for promoting crystallization, or the like) to form a crystalline semiconductor film. After that, the obtained crystalline semiconductor film is etched so as to have a desired shape; thereby forming crystalline semiconductor films 704*a* to 704*d*. Then, a gate insulating film 705 is formed so as to cover the crystalline semiconductor films 704*a* to 704*d* (FIG. 6B).

An example of a manufacturing step of the crystalline semiconductor films 704*a* to 704*d* will be briefly described hereinafter. First, an amorphous semiconductor film with a thickness of 50 to 60 nm is formed by using a plasma CVD method. Next, a solution containing nickel that is a metal element for promoting crystallization is retained on the amorphous semiconductor film, and a dehydrogenation treatment (at 500° C., for one hour) and a thermal crystallization treatment (at 550° C., for four hours) are performed on the amorphous semiconductor film; thereby forming a crystalline semiconductor film. After that, the crystalline semiconductor film is irradiated with laser light as needed, and a photolithography method is used, so that the crystalline semiconductor films 704*a* to 704*d* are formed.

In a case of forming a crystalline semiconductor film by using a laser crystallization method, a continuous wave laser beam (a CW laser beam) or a pulsed wave laser beam (a pulsed laser beam) may be used. As a laser beam which can be used here, a laser emitted from one or more of the following can be used: a gas laser such as an Ar laser, a Kr laser or an excimer laser; a laser of which the medium is single crystalline YAG, YVO$_4$, forsterite (Mg$_2$SiO$_4$), YAlO$_3$, GdVO$_4$, or polycrystalline (ceramic) YAG, Y$_2$O$_3$, YVO$_4$, YAlO$_3$, GdVO$_4$, each added with one or more of Nd, Yb, Cr, Ti, Ho, Er, Tm and Ta as a dopant; a glass laser; a ruby laser; an alexandrite laser; a Ti: sapphire laser; a copper vapor laser; or a gold vapor laser. It is possible to obtain crystals with a large grain size when fundamental waves of such laser beams or second to fourth harmonics of the fundamental waves are used. For example, the second harmonic (532 nm) or the third harmonic (355 nm) of an Nd:YVO$_4$ laser (fundamental wave of 1064 nm) can be used. In this case, an energy density of about 0.01 to 100 MW/cm$^2$ (preferably, 0.1 to 10 MW/cm$^2$) is required. The scanning rate is set to be about 10 to 2000 cm/sec to irradiate the semiconductor film. It is to be noted that, a laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ added with one or more of Nd, Yb, Cr, Ti, Ho, Er, Tm, and Ta as a dopant; an Ar ion laser; or a Ti:sapphire laser can be continuously oscillated. Furthermore, pulse oscillation thereof can be performed with an oscillation frequency of 10 MHz or more by carrying out Q switch operation or mode synchronization. When a laser beam is oscillated with an oscillation frequency of 10 MHz or more, a semiconductor film is irradiated with a next pulse while the semiconductor film is melted by the laser and then is solidified. Therefore, unlike a case of using a pulsed laser with a low oscillation frequency, a solid-liquid interface can be continuously moved in the semiconductor film, so that crystal grains which continuously grow toward a scanning direction can be obtained.

In addition, when the crystallization of the amorphous semiconductor film is performed by using the metal element for promoting crystallization, it is advantageous in that the crystallization can be performed at a low temperature in a short amount of time, and that the direction of crystals becomes uniform. On the other hand, there is a problem that the property is not stable because the off current is increased due to the remaining metal element in the crystalline semiconductor film. Therefore, it is preferable to form an amorphous semiconductor film functioning as a gettering site over the crystalline semiconductor film. In order to form a gettering site, the amorphous semiconductor film is required to contain an impurity element such as phosphorus or argon, and therefore, the amorphous semiconductor film is preferably formed by a sputtering method by which argon can be contained at a high concentration. After that, a heat treatment (an RTA method, thermal annealing using an annealing furnace, or the like) is performed to diffuse the metal element into the amorphous semiconductor film, and the amorphous semiconductor film containing the metal element is removed. In this manner, the contained amount of the metal element in the crystalline semiconductor film can be reduced or removed.

Next, a gate insulating film 705 covering the crystalline semiconductor films 704*a* to 704*d* is formed. As the gate insulating film 705, a single layer or a stacked layer of a film containing an oxide of silicon or a nitride of silicon is formed by a CVD method, a sputtering method, or the like. Specifically, a film containing silicon oxide, a film containing silicon oxynitride, or a film containing silicon nitride oxide is formed as a single layer or a stacked layer.

Alternatively, the gate insulating film 705 may be formed by performing the above-described high-density plasma treatment on the semiconductor films 704*a* to 704*d* to oxidize or nitride the surfaces. For example, the film is formed by a plasma treatment introducing a mixed gas of a rare gas such as He, Ar, Kr or Xe and oxygen, nitrogen oxide (NO$_2$), ammonia, nitrogen, hydrogen or the like. When excitation of the plasma in this case is performed by introduction of a microwave, high density plasma with low electron temperature can be generated. By an oxygen radical (there is a case where an OH radical is included) or a nitrogen radical (there is a case where an NH radical is included) generated by this high-density plasma, the surface of the semiconductor film can be oxidized or nitrided.

By a treatment using such high-density plasma, an insulating film with a thickness of 1 to 20 nm, typically 5 to 10 nm, is formed over a semiconductor film. Since the reaction of this case is a solid-phase reaction, an interface state density between the insulating film and the semiconductor film can be extremely low. Since a high-density plasma treatment like this oxidizes (or nitrides) a semiconductor film (crystalline silicon, or polycrystalline silicon) directly, unevenness of a thickness of the insulating film to be formed can be extremely small, ideally. In addition, oxidation is not strengthened even in a grain boundary of crystalline silicon, which makes a very preferable condition. That is, by a solid-phase oxidation of the surface of the semiconductor film by the high-density plasma treatment shown here, an insulating film with good uniformity and low interface state density can be formed without causing oxidation reaction abnormally in a grain boundary.

As the gate insulating film, an insulating film formed by the high-density plasma treatment may be used by itself, or an insulating film of silicon oxide, silicon oxynitride, silicon nitride or the like may be formed thereover by a CVD method using plasma or thermal reaction, so as to make a stacked layer. In any case, a transistor including an insulating film formed by high-density plasma, in a part of the gate insulating film or in the whole gate insulating film, can reduce unevenness of the property.

Furthermore, semiconductor films 704*a* to 704*d* obtained by irradiating semiconductor films with a continuous wave laser or a laser beam oscillated with a frequency of 10 MHz or more for crystallization, scanning in one direction, have a property that the crystal grows in the scanning direction of the beam. When a transistor is placed so that the scanning direction is aligned with the channel length direction (the direction in which carriers flow when a channel forming region is formed) and the above-described gate insulating layer is used, a thin film transistor (TFT) with fewer variation in property and high electron field-effect mobility can be obtained.

Next, a first conductive film and a second conductive film are formed laminated over the gate insulating film 705. Here, the first conductive film is formed with a thickness of 20 to 100 nm by a plasma CVD method, a sputtering method or the like, and the second conductive film is formed with a thickness of 100 to 400 nm. The first conductive film and the second conductive film are formed using an element selected from tantalum (Ta), tungsten (W), titanium (Ti), molybdenum (Mo), aluminum (Al), copper (Cu), chromium (Cr), niobium (Nb) or the like, or an alloy material or a compound material containing the above-described element as its main component. Alternatively, they are formed using a semiconductor material represented by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten and tantalum nitride have high heat resistance, a heat treatment for thermal activation can be performed after the first conductive film and the second conductive film are formed. In addition, in a case of a three-layer structure instead of a two-layer structure, a stacked layer structure of a molybdenum film, an aluminum film and a molybdenum film may be adopted.

Next, a resist mask is formed by a photolithography method, and an etching treatment for forming a gate electrode and a gate line is performed, so that gate electrodes 707 are formed above the semiconductor films 704a to 704d.

Next, a resist mask is formed by a photolithography method, and an impurity element giving n-type conductivity is added at a low concentration to the crystalline semiconductor films 704a to 704d, by an ion doping method or an ion implantation method. As the impurity element giving n-type conductivity, an element which belongs to Group 15 may be used; for example, phosphorus (P) and arsenic (As) are used.

Next, an insulating film is formed so as to cover the gate insulating film 705 and the gate electrodes 707. The insulating film is formed as a single layer or a stacked layer of a film containing an inorganic material such as silicon, an oxide of silicon, or a nitride of silicon, or an organic material such as an organic resin, by a plasma CVD method, a sputtering method, or the like. Next, the insulating film is selectively etched by anisotropic etching mainly in a vertical direction, so that insulating films 708 (also referred to as side walls) which are in contact with the side surfaces of the gate electrodes 707 are formed. The insulating films 708 are used as masks for doping when LDD (Lightly Doped drain) regions are formed later.

Figure 6C:
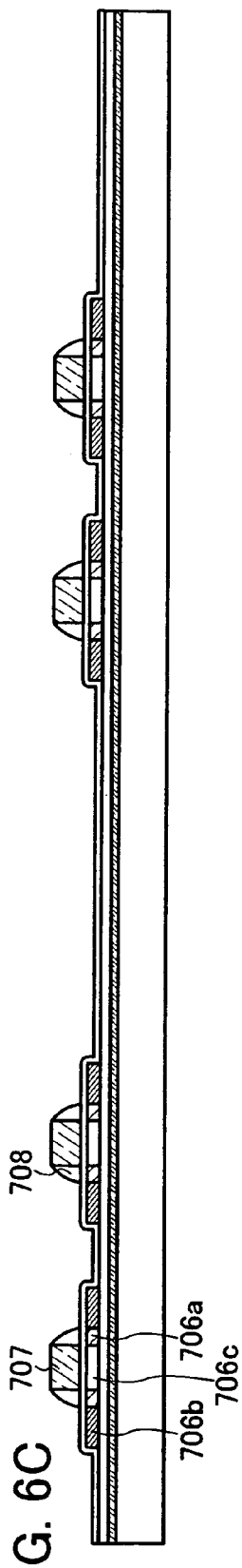

Next, using a resist mask formed by a photolithography method, the gate electrodes 707 and the gate insulating films 708 as masks, an impurity element giving n-type conductivity is added to the crystalline semiconductor films 704a to 704d, so that first n-type impurity regions 706a (also referred to as LDD regions), second n-type impurity regions 706b, and channel regions 706c are formed (FIG. 6C). A concentration of an impurity element contained in the first n-type impurity region 706a is lower than a concentration of an impurity element contained in the second n-type impurity region 706b.

Figure 6D:
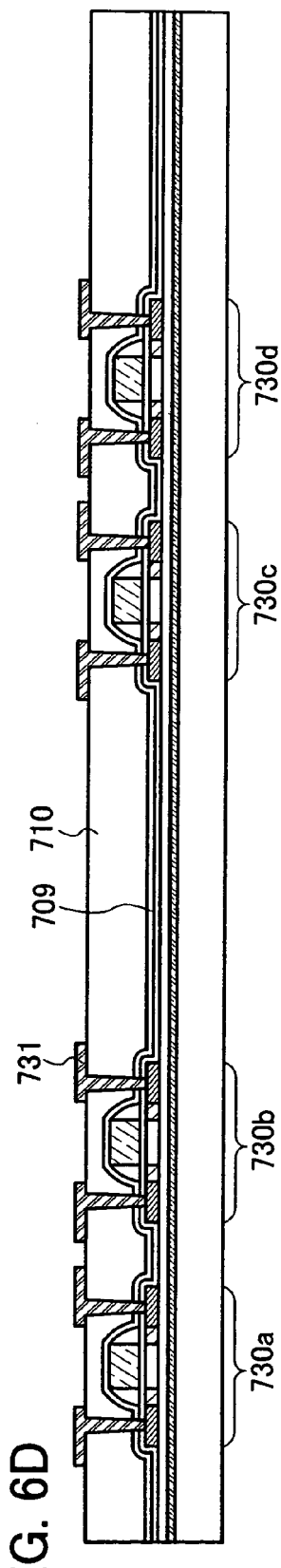

Subsequently, an insulating film is formed as a single layer or a stacked layer so as to cover the gate electrodes 707 and the insulating films 708; thereby forming thin film transistors 730a to 730d (FIG. 6D). The insulating film is formed as a single layer or a stacked layer using an inorganic material such as an oxide of silicon or a nitride of silicon, an organic material such as polyimide, polyamide, benzocyclobutene, acrylic, or epoxy, or a siloxane material, or the like, by a CVD method, a sputtering method, an SOG method, a droplet discharging method, a screen printing method, or the like. For example, in a case where the insulating film has a two-layer structure, a silicon nitride oxide film may be formed as a first insulating film 709, and a silicon oxynitride film may be formed as a second insulating film 710.

It is to be noted that before the insulating films 709 and 710 are formed or after one or more of thin films of the insulating films 709 and 710 are formed, a heat treatment for recovering the crystallinity of the semiconductor film, for activating the impurity element which has been added into the semiconductor film, or for hydrogenating the semiconductor film may be performed. For the heat treatment, a thermal annealing method, a laser annealing method, an RTA method, or the like may be adopted.

Next, the insulating films 709, 710, and the like are etched by a photolithography method, and contact holes are formed to expose the second n-type impurity regions 706b. Subsequently, a conductive film is formed so as to fill the contact holes and the conductive film is selectively etched so as to form conductive films 731. It is to be noted that a silicide may be formed over the surfaces of the semiconductor films 704a to 704d exposed by the contact holes.

The conductive film 731 is formed as a single layer or a stacked layer using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or a silicon (Si), or an alloy material or a compound material containing the above-described element as its main component by a CVD method, a sputtering method, or the like. An alloy material containing aluminum as its main component corresponds to a material containing nickel whose main component is aluminum or an alloy material containing nickel and one or both of carbon and silicon whose main component is aluminum, for example. The conductive film 731 preferably employs, for example, a stacked layer structure of a barrier film, an aluminum-silicon (Al—Si) film, and a barrier film, or a stacked layer structure of a barrier film, an aluminum-silicon (Al—Si) film, a titanium nitride (TiN) film and a barrier film. It is to be noted that a barrier film corresponds to a thin film formed by using titanium, a nitride of titanium, molybdenum, or a nitride of molybdenum. Aluminum and aluminum-silicon which have low resistance and are inexpensive are optimal materials for forming the conductive film 731. In addition, generation of a hillock of aluminum or aluminum-silicon can be prevented when upper and lower barrier layers are formed. Furthermore, when the barrier film is formed by using titanium that is a highly-reducible element, even if a thin natural oxide film is formed over the crystalline semiconductor film, the natural oxide film is reduced so that preferable contact with the crystalline semiconductor film can be obtained.

Next, an insulating film 711 is formed so as to cover the conductive films 731, and conductive films 712 are formed over the insulating film 711 so as to be electrically connected to the conductive films 731 (FIG. 7A). The insulating film 711 is formed as a single layer or a stacked layer using an inorganic material or an organic material by a CVD method, a sputtering method, an SOG method, a droplet discharging method, a screen printing method or the like. The insulating film 711 is preferably formed with a thickness of 0.75 to 3 μm. Furthermore, the conductive film 712 may be formed using any of the materials given for the conductive film 731.

Next, conductive films 713 are formed over the conductive films 712. The conductive film 713 is formed using a conductive material, by using a CVD method, a sputtering method, a droplet discharging method, a screen printing method, or the like (FIG. 7B). Preferably, the conductive film 713 is formed as a single layer or a stacked layer using an element selected from aluminum (Al), titanium (Ti), silver (Ag), copper (Cu), or gold (Au), or an alloy material or a compound material containing the above-described element as its main component. Here, a paste containing silver is formed over the conductive films 712 by a screen printing method, and then, a heat treatment at 50 to 350° C. is performed; thereby forming the conductive films 713. In addition, after the conductive films 713 are formed over the conductive films 712, regions where the conductive films 713 and the conductive films 712 overlap each other may be irradiated with laser light so as to improve electrical connection thereof. It is to be noted that it is possible to selectively form the conductive films 713 over the conductive films 731 without forming the insulating film 711 and the conductive films 712.

Next, an insulating film 714 is formed so as to cover the conductive films 712 and 713, and the insulating film 714 is selectively etched by a photolithography method; thereby forming opening portions 715 that expose the conductive films 713 (FIG. 7C). The insulating film 714 is formed as a single layer or a stacked layer using an inorganic material or an organic material, by a CVD method, a sputtering method, an SOG method, a droplet discharging method, a screen printing method, or the like.

Next, a layer 732 including the thin film transistors 730a to 730d and the like is peeled from the substrate 701. Here, opening portions 716 are formed by laser light irradiation (such as UV light) (FIG. 8A), and then, the layer 732 can be peeled from the substrate 701 by using physical force. Alternatively, an etchant may be introduced to the opening portions 716 before peeling the layer 732 from the substrate 701; thereby removing the peeling layer 702. As the etchant, a gas or a liquid containing halogen fluoride or an interhalogen compound is used; for example, chlorine trifluoride ($ClF_3$) is used as a gas containing halogen fluoride. Accordingly, the layer 732 is peeled from the substrate 701. The peeling layer 702 may be partially left instead of being removed entirely. By leaving a part of the peeling layer 702, consumption of the etchant can be reduced and time for removing the peeling layer can be shortened. In addition, the layer 732 can be retained at the substrate 701 even after the peeling layer 702 is removed. In addition, it is preferable to reuse the substrate 701 after the layer 732 is peeled off, in order to reduce the cost.

Figure 8A:
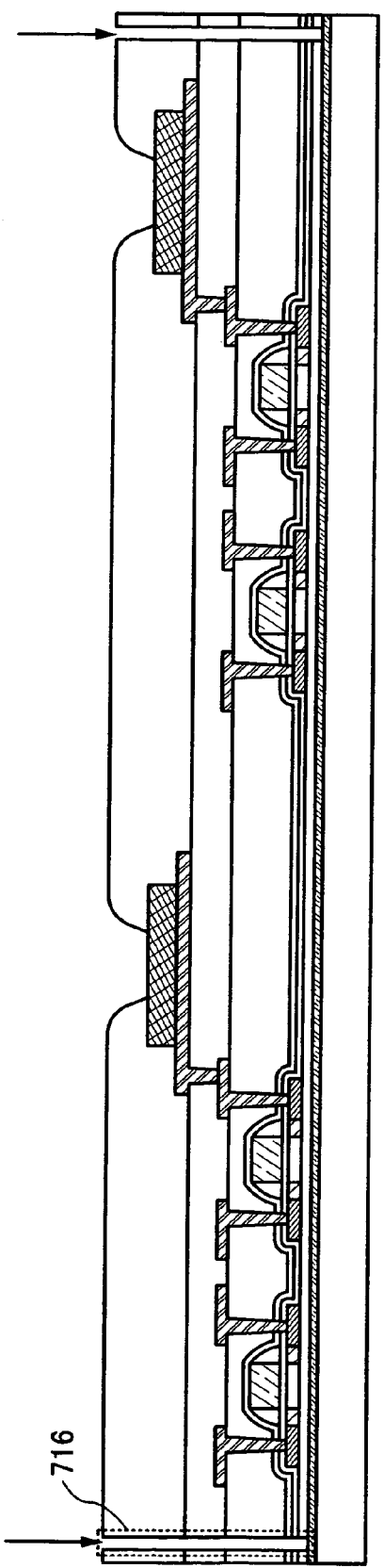
FIGS. 8A and 8B are views showing an example of a manufacturing method of a semiconductor device of the present invention.
Figure 8B:
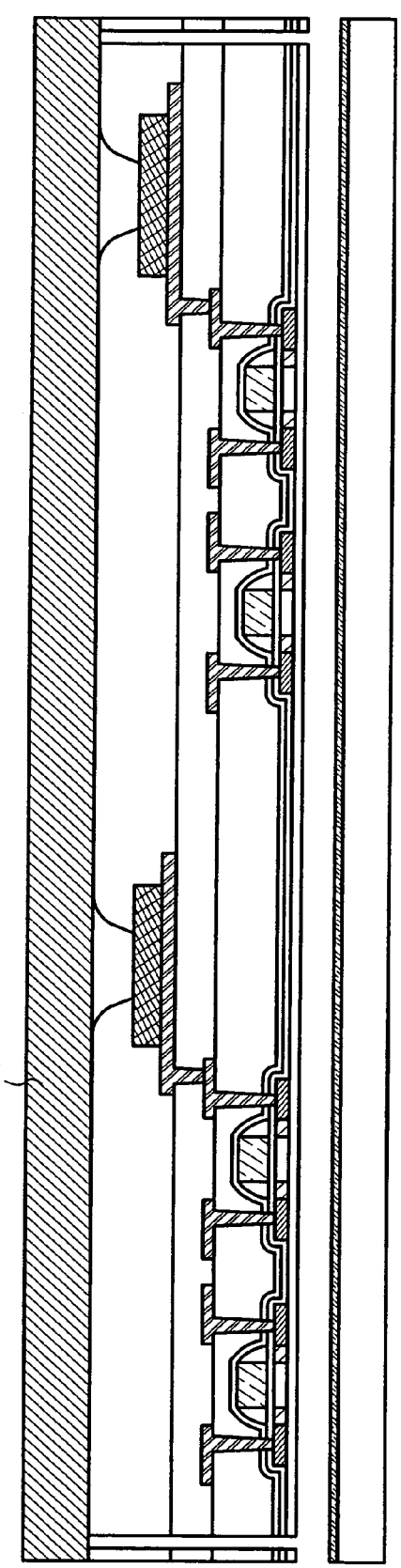

Here, after the opening portions 716 are formed by etching the insulating film by using laser light irradiation, a surface of the layer 732 (a surface where the insulating film 714 is exposed) is attached to a first sheet material 717 and the layer 732 is peeled completely from the substrate 701 (FIG. 8A). As the first sheet material 717, a thermal peeling tape of which adhesiveness is lowered by heat can be used, for example.

Figure 9A:
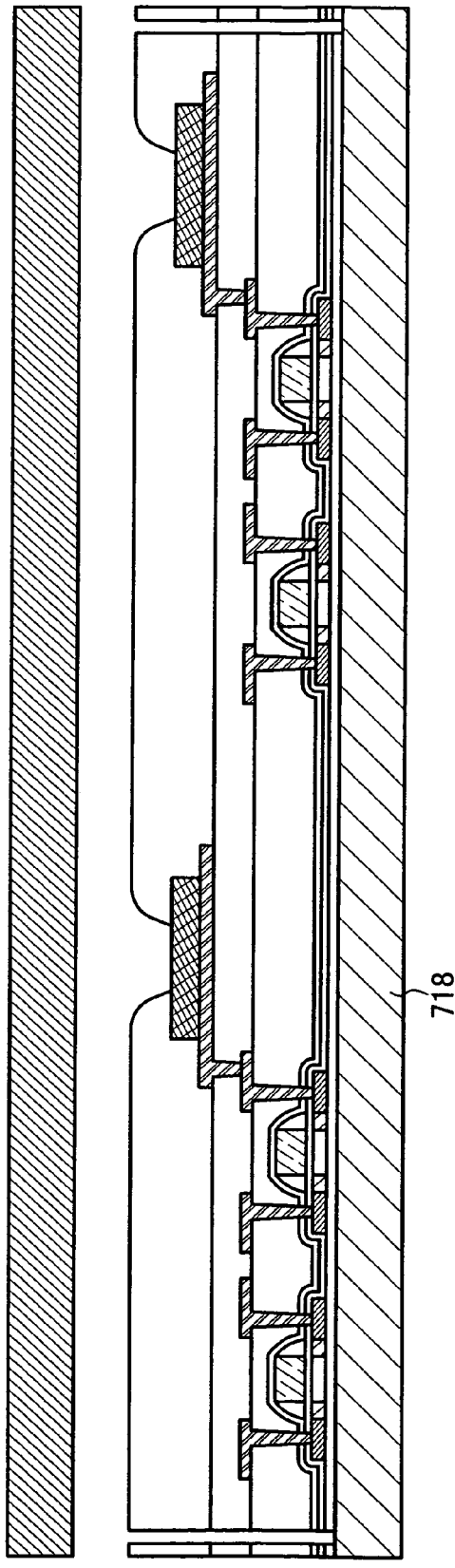
FIGS. 9A and 9B are views showing an example of a manufacturing method of a semiconductor device of the present invention.

Next, a second sheet material 718 is placed over the other surface (the surface peeled from the substrate 701) of the layer 732, and one or both of a heat treatment and a pressure treatment are performed to attach the second sheet material 718. Concurrently with or after placing the second sheet material 718, the first sheet material 717 is peeled from the layer 732 (FIG. 9A). As the second sheet material 718, a hot-melt film or the like can be used. When a thermal peeling tape is used as the first sheet material 717, the peeling can be performed by using the heat applied for attaching the second sheet material 718.

As the second sheet material 718, a film on which an antistatic treatment for preventing static electricity or the like is performed (hereinafter referred to as an antistatic film) may be used. As the antistatic film, a film with an antistatic material dispersed in a resin, a film with an antistatic material attached thereon, and the like can be given as examples. The film provided with an antistatic material may be a film with an antistatic material provided over one of its surfaces, or a film with an antistatic material provided over each of its surfaces. As for the film with an antistatic material provided over one of its surfaces, the film may be attached to the layer so that the antistatic material is placed on the inner side of the film or the outer side of the film. The antistatic material may be provided over the entire surface of the film, or over a part of the film. As the antistatic material here, a metal, indium tin oxide (ITO), a surfactant such as an amphoteric surfactant, a cationic surfactant, or a nonionic surfactant can be used. In addition to that, as the antistatic material, a resin material containing crosslinkable copolymer having a carboxyl group and a quaternary ammonium base on its side chain, or the like can be used. By attaching, mixing, or applying such a material to a film, an antistatic film can be formed. By performing the sealing using the antistatic film, adverse effects on a semiconductor element, when dealt with as a commercial product, due to static electricity from outside can be prevented.

Figure 9B:
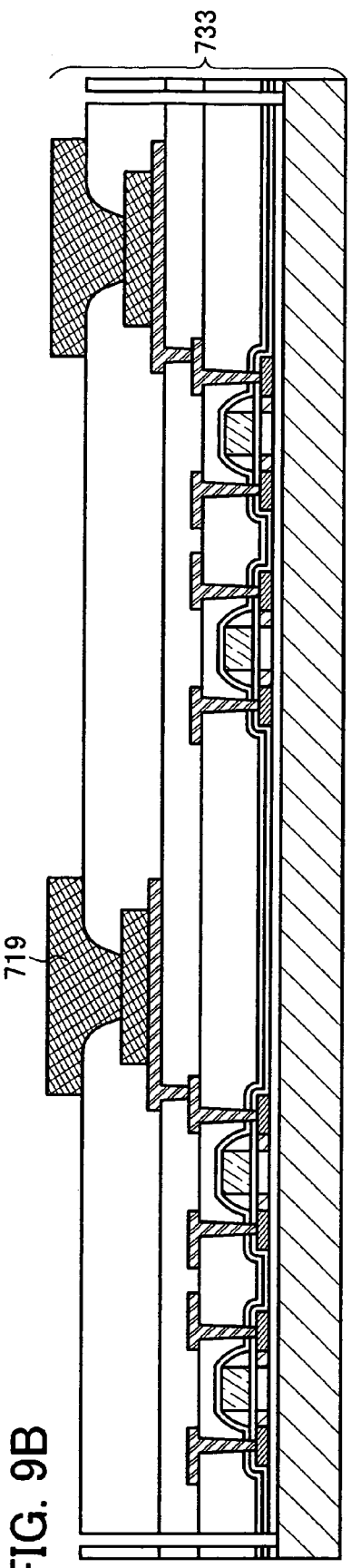

Next, conductive films 719 are formed so as to cover the opening portions 715, and an element group 733 is formed (FIG. 9B). It is to be noted that, before or after the formation of the conductive films 719, the conductive films 712 and 713 may be irradiated with laser light so as to improve electrical connection thereof.

Next, the element group 733 is selectively irradiated with laser light so as to be divided into a plurality of element groups (FIG. 10A).

Next, the element group 733 is pressure-bonded to a substrate 721 over which a conductive film 722 functioning as an antenna is formed (FIG. 10B). Specifically, as described in the above embodiment mode, the element group 733 is attached to the substrate 721 so that the conductive film 722 functioning as an antenna formed over the substrate 721 and the conductive film 719 of the element group 733 are electrically connected to each other. Here, the substrate 721 and the element group 733 are bonded to each other by using a resin 723 having adhesiveness. In addition, the conductive film 722 and the conductive film 719 are electrically connected to each other by using a conductive particle 724 contained in the resin 723.

It is to be noted that any of the pressure bonding apparatuses and the pressure bonding methods described in the above embodiment modes can be used. The element group 733 of this embodiment mode has flexibility, so that the thin film transistor is easily damaged by pressure bonding with a heat treatment. Therefore, by performing the pressure bonding while monitoring pressure applied to a region where the transistor is formed, as described in the above embodiment mode, damage to the thin film transistors 730a to 730d can be effectively prevented.

It is to be noted that this embodiment mode can be freely combined with the above embodiment modes. In other words, the material or the formation method described in the above embodiment modes can be used in combination also in this embodiment mode, and the material or the formation method described in this embodiment mode can be used in combination also in the above embodiment modes.

Embodiment Mode 6

In this embodiment mode, an example of a usage mode of a semiconductor device obtained by using the manufacturing method described in the above embodiment mode will be described. Specifically, applications of a semiconductor device which can input and output data without contact will be described with reference to drawings. The semiconductor device which can input and output data without contact is also referred to as an RFID tag, an ID tag, an IC tag, an IC chip, an RF tag, a wireless tag, an electronic tag, or a wireless chip depending on application modes.

Figure 11A:
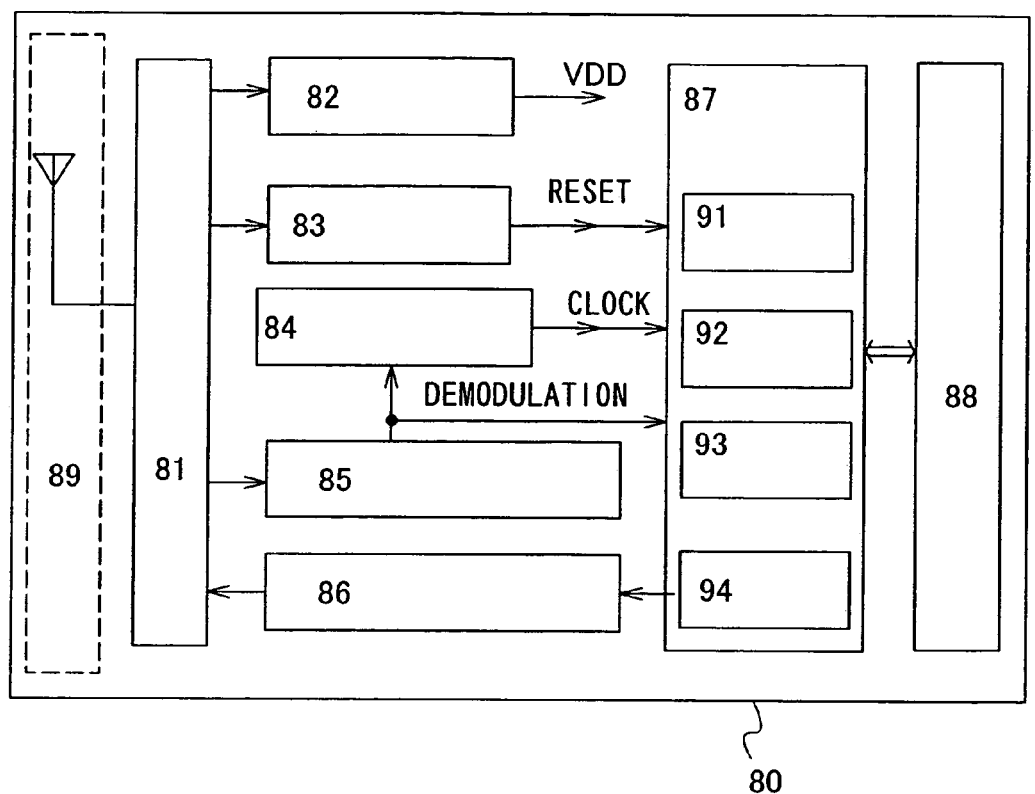
FIGS. 11A to 11C are views showing an example of a usage mode of a semiconductor device of the present invention.

A semiconductor device 80 has a function of communicating data without contact, and includes a high frequency circuit 81, a power supply circuit 82, a reset circuit 83, a clock generation circuit 84, a data demodulation circuit 85, a data modulation circuit 86, a control circuit 87 for controlling other circuits, a storage circuit 88, and an antenna 89 (FIG. 11A). The high frequency circuit 81 is a circuit which receives a signal from the antenna 89 and outputs a signal received by the data modulation circuit 86 from the antenna 89. The power supply circuit 82 is a circuit which generates a power supply potential from the received signal. The reset circuit 83 is a circuit which generates a reset signal. The clock generation circuit 84 is a circuit which generates various clock signals based on the received signal input from the antenna 89. The data demodulation circuit 85 is a circuit which demodulates the received signal and outputs the signal to the control circuit 87. The data modulation circuit 86 is a circuit which modulates a signal received from the control circuit 87. As the control circuit 87, a code extraction circuit 91, a code determination circuit 92, a CRC determination circuit 93, and an output unit circuit 94 are formed, for example. It is to be noted that the code extraction circuit 91 is a circuit which separately extracts a plurality of codes included in an instruction transmitted to the control circuit 87. The code determination circuit 92 is a circuit which compares the extracted code and a code corresponding to a reference to determine the content of the instruction. The CRC circuit is a circuit which detects the presence or absence of a transmission error or the like based on the determined code.

Next, an example of operation of the above-described semiconductor device will be explained. First, a radio signal is received by the antenna 89. The radio signal is transmitted to the power supply circuit 82 via the high frequency circuit 81, and a high power supply potential (hereinafter referred to as VDD) is generated. The VDD is supplied to each circuit included in the semiconductor device 80. In addition, a signal transmitted to the data demodulation circuit 85 via the high frequency circuit 81 is demodulated (hereinafter, a demodulated signal). Furthermore, a signal transmitted through the reset circuit 83 and the clock generation circuit 84 via the high frequency circuit 81 and the demodulated signal are transmitted to the control circuit 87. The signal transmitted to the control circuit 87 is analyzed by the code extraction circuit 91, the code determination circuit 92, the CRC determination circuit 93, and the like. Then, in accordance with the analyzed signal, information of the semiconductor device stored in the storage circuit 88 is output. The output information of the semiconductor device is encoded through the output unit circuit 94. Furthermore, the encoded information of the semiconductor device 80 is transmitted by the antenna 89 as a radio signal through the data modulation circuit 86. It is to be noted that a low power supply potential (hereinafter, VSS) is common among a plurality of circuits included in the semiconductor device 80, and VSS can be GND.

Thus, data of the semiconductor device can be read by transmitting a signal from a reader/writer to the semiconductor device 80 and receiving the signal transmitted from the semiconductor device 80 by the reader/writer.

In addition, the semiconductor device 80 may supply a power supply voltage to each circuit by an electromagnetic wave without a power source (battery) mounted, or by an electromagnetic wave and a power source (battery) with the power source (battery) mounted.

Since a semiconductor device which can be bent can be manufactured by using the manufacturing method described in the above embodiment modes, the semiconductor device can be attached to an object having a curved surface.

Figure 11B:
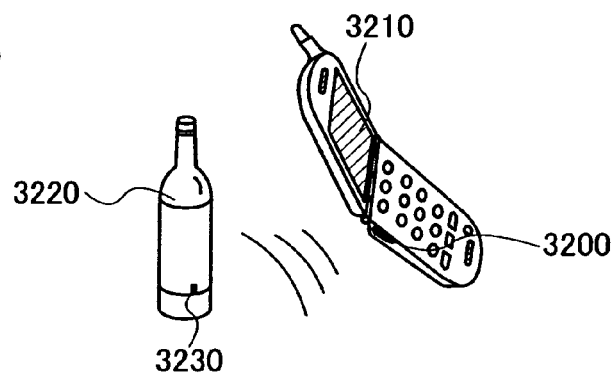
Figure 11C:
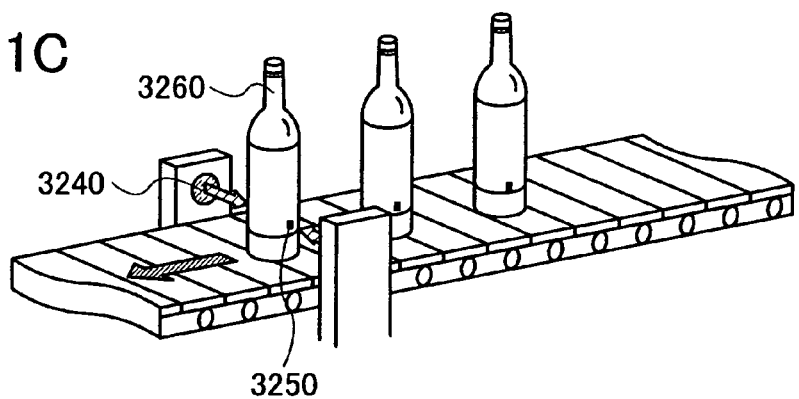

Next, an example of an application of a semiconductor device which can input and output data without contact will be explained. A side face of a portable terminal including a display portion 3210 is provided with a reader/writer 3200, and a side face of an article 3220 is provided with a semiconductor device 3230 (FIG. 11B). When the reader/writer 3200 is held over the semiconductor device 3230 included in the article 3220, information on the article 3220 such as a raw material, the place of origin, an inspection result in each production process, the history of distribution, or an explanation of the article is displayed on the display portion 3210. Furthermore, when a product 3260 is transported by a conveyor belt, the product 3260 can be inspected using a reader/writer 3240 and a semiconductor device 3250 attached to the product 3260 (FIG. 11C). Thus, by utilizing the semiconductor device for a system, information can be acquired easily, and improvement in functionality and added value of the system can be achieved. As described in the above embodiment mode, a transistor or the like included in a semiconductor device can be prevented from being damaged even when the semiconductor device is attached to an object having a curved surface, and a reliable semiconductor device can be provided. It is to be noted that the pressure bonding apparatus or the pressure bonding method described in the above embodiment modes may be used when the semiconductor device is attached to a product. By using the above-described pressure bonding apparatus or pressure bonding method, excessive pressure is prevented from being applied to the semiconductor device when the semiconductor device is attached to the product, and damage to the semiconductor device can be prevented.

In addition, as a signal transmission method in the above-described semiconductor device which can input and output data without contact, an electromagnetic coupling method, an electromagnetic induction method, a microwave method, or the like can be used. The transmission method may be arbitrarily selected by a practitioner in consideration of an intended use, and an optimum antenna may be provided in accordance with the transmission method.

In a case of employing, for example, an electromagnetic coupling method or an electromagnetic induction method (for example, a 13.56 MHz band) as the signal transmission method in the semiconductor device, electromagnetic induction caused by a change in magnetic field density is used. Therefore, the conductive film functioning as an antenna is formed in an annular shape (for example, a loop antenna) or a spiral shape (for example, a spiral antenna).

Figure 13A:
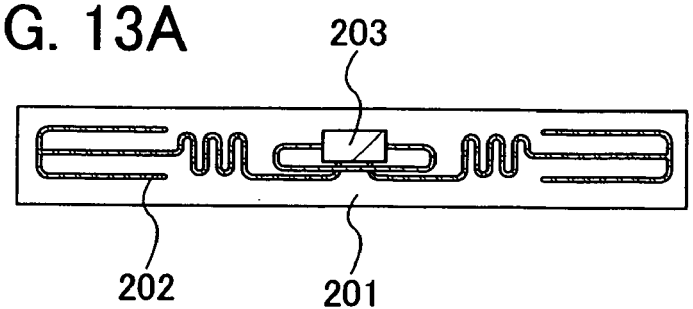
FIGS. 13A to 13D are views each showing an example of an antenna shape of a semiconductor device of the present invention.
Figure 13B:
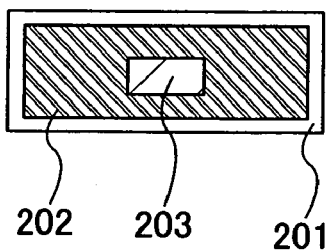
Figure 13C:
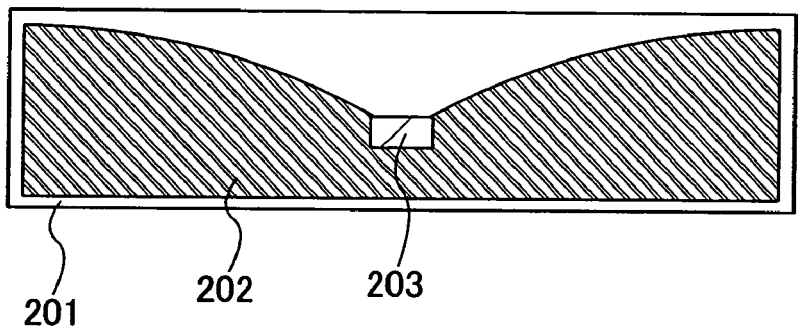
Figure 13D:
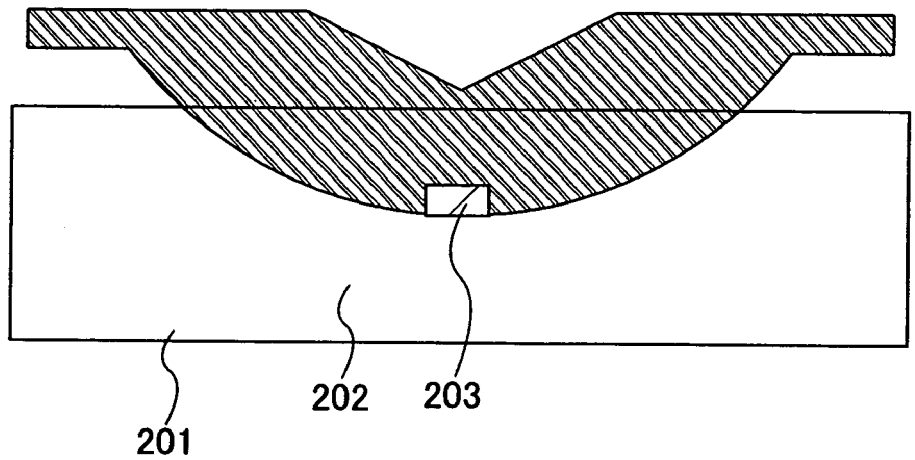

In a case of employing, for example, a microwave method (for example, a UHF band (860 to 960 MHz band), a 2.45 GHz band, or the like) as the signal transmission method in the semiconductor device, the shape such as a length of the conductive film functioning as an antenna may be arbitrarily set in consideration of a wavelength of an electromagnetic wave used for signal transmission. For example, the conductive film functioning as an antenna can be formed in a linear shape (for example, a dipole antenna (FIG. 13A)), a flat shape (for example, a patch antenna (FIG. 13B)), a ribbon-like shape (FIGS. 13C and 13D), or the like. The shape of the conductive film functioning as an antenna is not limited to a linear shape, and the conductive film functioning as an antenna may be formed in a curved-line shape, a meander shape, or a combination thereof, in consideration of a wavelength of an electromagnetic wave. Whichever shape the conductive film functioning as an antenna is formed in, damage to the element group or the like can be prevented by controlling the pressure applied to the element group when the element group is attached to the substrate while monitoring the pressure applied to the element group so that excessive pressure is prevented from being applied.

The conductive film functioning as an antenna is formed using a conductive material by a CVD method, a sputtering method, a printing method such as screen printing or gravure printing, a droplet discharging method, a dispenser method, a plating method, or the like. The conductive film is formed with a single-layer structure or a stacked layer structure of an element selected from aluminum (Al), titanium (Ti), silver (Ag), copper (Cu), gold (Au), platinum (Pt), nickel (Ni), palladium (Pd), tantalum (Ta), and molybdenum (Mo) or an alloy material or a compound material containing the element as its main component.

In a case of forming a conductive film functioning as an antenna by using, for example, a screen printing method, the conductive film can be formed by selectively printing a conductive paste in which conductive particles each having a grain size of several nm to several tens of μm are dissolved or dispersed in an organic resin. As the conductive particle, a fine particle or a dispersive nanoparticle of one or more metals of silver (Ag), gold (Au), copper (Cu), nickel (Ni), platinum (Pt), palladium (Pd), tantalum (Ta), molybdenum (Mo), and titanium (Ti) or silver halide can be used. In addition, as the organic resin contained in the conductive paste, one or a plurality of organic resins each functioning as a binder, a solvent, a dispersant, or a coating of the metal particle can be used. Typically, an organic resin such as an epoxy resin or a silicon resin can be used. When forming a conductive film, baking is preferably performed after the conductive paste is applied. For example, in a case of using fine particles (of which grain size is 1 nm to 100 nm inclusive) containing silver as its main component as a material of the conductive paste, a conductive film can be obtained by hardening the conductive paste by baking at a temperature of 150 to 300° C. Alternatively, fine particles containing solder or lead-free solder as its main component may be used; in this case, it is preferable to use a fine particle having a grain size of 20 μm or less. Solder or lead-free solder has an advantage such as low cost.

Besides the above-mentioned materials, ceramic, ferrite, or the like may be applied to an antenna. Furthermore, a material of which dielectric constant and magnetic permeability are negative in a microwave band (metamaterial) can be applied to an antenna.

In a case of applying an electromagnetic coupling method or an electromagnetic induction method, and placing a semiconductor device including an antenna in contact with a metal, a magnetic material having magnetic permeability is preferably interposed between the semiconductor device and the metal. In the case of placing a semiconductor device including an antenna in contact with a metal, an eddy current flows in the metal accompanying change in a magnetic field, and a demagnetizing field generated by the eddy current impairs a change in a magnetic field and decreases a communication range. Therefore, an eddy current of the metal and a decrease in the communication range can be suppressed by interposing a material having magnetic permeability between the semiconductor device and the metal. It is to be noted that ferrite or a metal thin film having high magnetic permeability and little loss of high frequency wave can be used as the magnetic material.

It is to be noted that an applicable range of the flexible semiconductor device is wide in addition to the above, and the flexible semiconductor device can be applied to any product as long as it clarifies information such as the history of an object without contact and is useful for production, management, or the like. For example, the semiconductor device can be mounted on paper money, coins, securities, certificates, bearer bonds, packing containers, books, recording media, personal belongings, vehicles, food, clothing, health products, commodities, medicine, electronic devices, and the like. Examples of them will be explained with reference to FIGS. 12A to 12H.

Figures 12A, 12B, 12C:
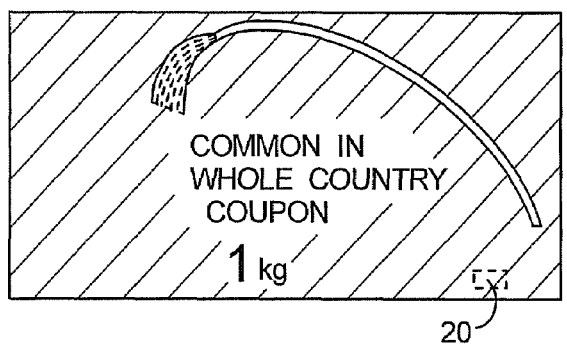
FIGS. 12A to 12H are views each showing an example of a usage mode of a semiconductor device of the present invention.
Figure 12E:
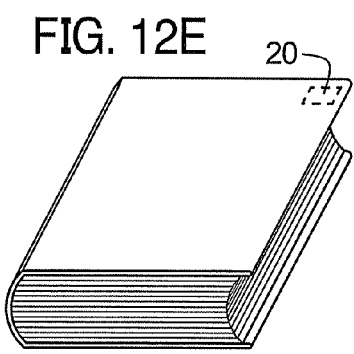
Figure 12D:
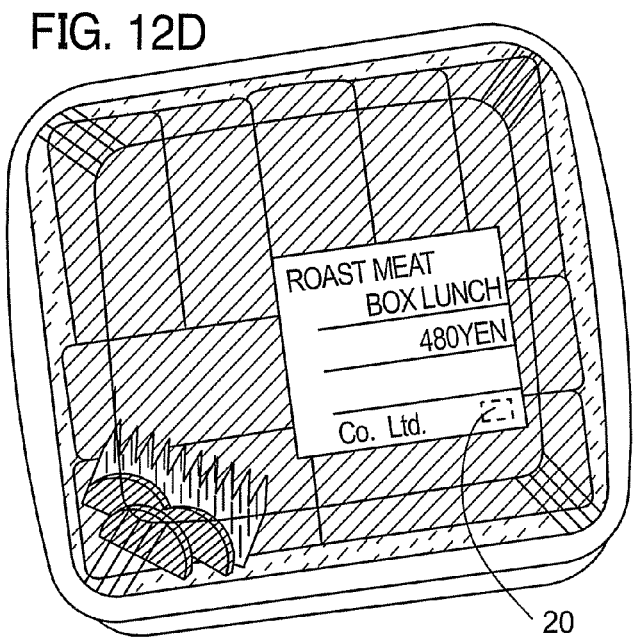
Figure 12G:
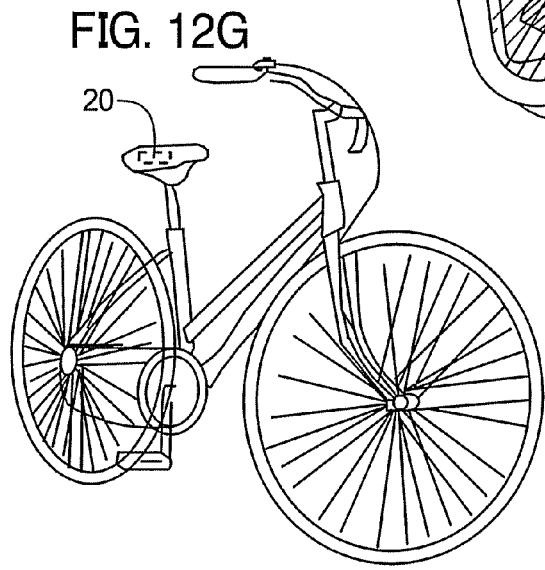
Figure 12F:
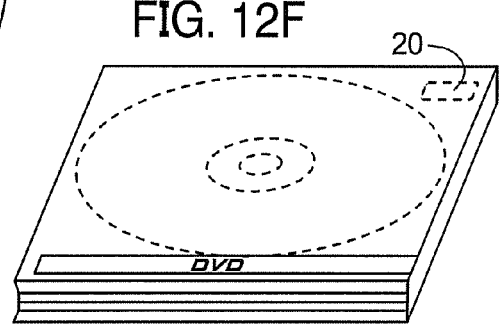
Figure 12H:

The paper money and coins are money distributed to the market, and include one valid in a certain area (cash voucher), memorial coins, and the like. The securities refer to checks, certificates, promissory notes, and the like (FIG. 12A). The certificates refer to driver's licenses, certificates of residence, and the like (FIG. 12B). The bearer bonds refer to stamps, rice coupons, various gift certificates, and the like (FIG. 12C). The packing containers refer to wrapping paper for food containers and the like, plastic bottles, and the like (FIG. 12D). The books refer to hardbacks, paperbacks, and the like (FIG. 12E). The recording media refer to DVD software, video tapes, and the like (FIG. 12F). The vehicles refer to wheeled vehicles such as bicycles, ships, and the like (FIG. 12G). The personal belongings refer to bags, glasses, and the like (FIG. 12H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and flat-screen TV sets), cellular phones, and the like.

Forgery can be prevented by providing the paper money, the coins, the securities, the certificates, the bearer bonds, or the like with the semiconductor device 80. The efficiency of an inspection system, a system used in a rental shop, or the like can be improved by providing the packing containers, the books, the recording media, the personal belongings, the food, the commodities, the electronic devices, or the like with the semiconductor device 80. Forgery or theft can be prevented by providing the vehicles, the health products, the medicine, or the like with the semiconductor device 80; further, in a case of the medicine, medicine can be prevented from being taken mistakenly. The semiconductor device 80 can be mounted on the foregoing article by being attached to the surface or being embedded therein. For example, in a case of a book, the semiconductor device 80 may be embedded in a piece of paper; in the case of a package made from an organic resin, the semiconductor device 80 may be embedded in the organic resin. Even when the semiconductor device is mounted on paper or the like, breakage or the like of an element included in the semiconductor device can be prevented by using the methods described in the above embodiment modes.

As described above, the efficiency of an inspection system, a system used in a rental shop, or the like can be improved by providing the packing containers, the recording media, the personal belonging, the food, the clothing, the commodities, the electronic devices, or the like with the semiconductor device. In addition, by providing the vehicles with the semiconductor device, forgery or theft can be prevented. Further, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

It is to be noted that this embodiment mode can be freely combined with the above embodiment modes. In other words, the material or the formation method described in the above embodiment modes can be used in combination also in this embodiment mode, and the material or the formation method described in this embodiment mode can be used in combination also in the above embodiment modes.

This application is based on Japanese Patent Application serial No. 2005-328030 filed in Japan Patent Office on Nov. 11, 2005, the contents of which are hereby incorporated by reference.

What is claimed is:

1. A pressure bonding method comprising:
   placing a substrate over a pressure detection film;
   placing an element group over the substrate so that a first conductive film formed over the substrate and a second conductive film of the element group overlap each other;
   pressure-bonding the substrate and the element group so that the first conductive film formed over the substrate and the second conductive film of the element group are electrically connected to each other;
   detecting a value and distribution of pressure applied to the element group, by the pressure detection film, at a time of the pressure bonding; and
   controlling pressure applied to the element group after the detection, based on the detected value and distribution of pressure.

2. A pressure bonding method according to claim 1, wherein a silicon diaphragm pressure sensor is used as the pressure detection film.

3. A pressure bonding method according to claim 1, wherein a pressure sensor with a pressure-sensitive conductive rubber interposed between a pair of electrodes is used as the pressure detection film.

4. A pressure bonding method according to claim 1, wherein an anisotropic conductive film or an anisotropic conductive paste is interposed between the substrate and the element group when the substrate and the element group are placed overlapping each other.

5. A pressure bonding method according to claim 1, wherein a heat treatment is concurrently performed at the time of the pressure bonding.

6. A pressure bonding method according to claim 1, wherein an element group having flexibility is used as the element group.

7. A pressure bonding method according to claim 1 wherein as the value and distribution of pressure, a value and distribution of pressure applied to a connection region where the first conductive film formed over the substrate and the second conductive film of the element group are connected to each other and pressure applied to a region other than the connection region in the element group are detected.

8. A pressure bonding method according to claim 7, wherein a silicon diaphragm pressure sensor is used as the pressure detection film.

9. A pressure bonding method according to claim 7, wherein a pressure sensor with a pressure-sensitive conductive rubber interposed between a pair of electrodes is used as the pressure detection film.

10. A pressure bonding method according to claim 7, wherein an anisotropic conductive film or an anisotropic conductive paste is interposed between the substrate and the element group when the substrate and the element group are placed overlapping each other.

11. A pressure bonding method according to claim 7, wherein a heat treatment is concurrently performed at the time of the pressure bonding.

12. A pressure bonding method according to claim 7, wherein an element group having flexibility is used as the element group.

13. A pressure bonding method according to claim 1 wherein the pressure detection film is a film that colors when pressure is applied thereto, and
    wherein the value and distribution of pressure are detected by optically measuring a tone of a color of the film that colors when pressure is applied thereto with an imaging device.

14. A pressure bonding method according to claim 13, wherein an anisotropic conductive film or an anisotropic conductive paste is interposed between the substrate and the element group when the substrate and the element group are placed overlapping each other.

15. A pressure bonding method according to claim 13, wherein a heat treatment is concurrently performed at the time of the pressure bonding.

16. A pressure bonding method according to claim 13, wherein an element group having flexibility is used as the element group.

17. A manufacturing method of a semiconductor device, comprising:
    forming a peeling layer over a first substrate;
    forming an element layer over the peeling layer, wherein the element layer includes an element formation layer including a transistor, a conductive film formed over the element formation layer so as to be electrically connected to the transistor, and a protective film formed so as to cover an edge portion of the conductive film;
    irradiating the element layer selectively with laser light and attaching a first sheet material to the element layer thereafter, and then peeling the element layer and the first sheet material from the first substrate;
    attaching a second sheet material to a surface of the element layer that is exposed by the peeling, and then peeling the first sheet material from the element layer;
    forming a conductive bump over the protective film so as to be electrically connected to the conductive film, so that an element group including the element layer, the conductive bump, and the second sheet material is formed;
    placing a second substrate over a pressure detection film;
    placing the element group selectively over the second substrate so that a conductive film functioning as an antenna formed over the second substrate and the conductive bump overlap each other;
    pressure-bonding the second substrate and the element group so that the conductive film formed over the second substrate and the conductive bump are electrically connected to each other;
    detecting a value and distribution of pressure applied to the element group, by the pressure detection film, at a time of the pressure bonding; and controlling pressure applied to the element group after the detection, based on the detected value and distribution of pressure.

18. A manufacturing method of a semiconductor device according to claim 17, wherein a silicon diaphragm pressure sensor is used as the pressure detection film.

19. A manufacturing method of a semiconductor device according to claim 17, wherein a pressure sensor with a pressure-sensitive conductive rubber interposed between a pair of electrodes is used as the pressure detection film.

20. A manufacturing method of a semiconductor device, according to claim 17, wherein an anisotropic conductive film or an anisotropic conductive paste is interposed between the second substrate and the element group, when the second substrate and the element group are placed overlapping each other.

21. A manufacturing method of a semiconductor device, according to claim 17, wherein a heat treatment is concurrently performed at the time of the pressure bonding.

22. A manufacturing method of a semiconductor device, according to claim 17, wherein a film having flexibility is used as the second sheet material.

23. A manufacturing method of a semiconductor device, comprising:
   forming a peeling layer over a first substrate;
   forming an element layer over the peeling layer, wherein the element layer includes an element formation layer including a transistor, a conductive film formed over the element formation layer so as to be electrically connected to the transistor, and a protective film formed so as to cover an edge portion of the conductive film;
   irradiating the element layer selectively with laser light and attaching a first sheet material to the element layer thereafter, and then peeling the element layer and the first sheet material from the first substrate;
   attaching a second sheet material to a surface of the element layer that is exposed by the peeling, and then peeling the first sheet material from the element layer;
   forming a conductive bump over the protective film so as to be electrically connected to the conductive film, so that an element group including the element layer, the conductive bump, and the second sheet material is formed;
   placing a second substrate over a film that colors when pressure is applied;
   placing the element group selectively over the second substrate so that a conductive film functioning as an antenna formed over the second substrate and the conductive bump overlap each other;
   pressure-bonding the second substrate and the element group so that the conductive film formed over the second substrate and the conductive bump are electrically connected to each other;
   detecting a value and distribution of pressure applied to the element group, by optically measuring a tone of a color of the film by an imaging device, at a time of the pressure bonding; and
   controlling pressure applied to the element group after the detection, based on the detected value and distribution of pressure.

24. A manufacturing method of a semiconductor device, according to claim 23, wherein an anisotropic conductive film or an anisotropic conductive paste is interposed between the second substrate and the element group, when the second substrate and the element group are placed overlapping each other.

25. A manufacturing method of a semiconductor device, according to claim 23, wherein a heat treatment is concurrently performed at the time of the pressure bonding.

26. A manufacturing method of a semiconductor device, according to claim 23, wherein a film having flexibility is used as the second sheet material.

27. A manufacturing method of a semiconductor device, comprising:
   placing a substrate over a pressure detection film;
   placing an element group comprising a transistor over the substrate so that a first conductive film formed over the substrate and a second conductive film of the element group overlap each other wherein the first conductive film comprises an antenna;
   pressure-bonding the substrate and the element group so that the first conductive film formed over the substrate and the second conductive film of the element group are electrically connected to each other;
   detecting a value and distribution of pressure applied to the element group, by the pressure detection film, at a time of the pressure bonding; and
   controlling pressure applied to the element group after the detection, based on the detected value and distribution of pressure.

28. A manufacturing method of a semiconductor device according to claim 27, wherein a silicon diaphragm pressure sensor is used as the pressure detection film.

29. A manufacturing method of a semiconductor device according to claim 27, wherein a pressure sensor with a pressure-sensitive conductive rubber interposed between a pair of electrodes is used as the pressure detection film.

30. A manufacturing method of a semiconductor device according to claim 27, wherein an anisotropic conductive film or an anisotropic conductive paste is interposed between the substrate and the element group when the substrate and the element group are placed overlapping each other.

31. A manufacturing method of a semiconductor device according to claim 27, wherein a heat treatment is concurrently performed at the time of the pressure bonding.

32. A manufacturing method of a semiconductor device according to claim 27, wherein an element group having flexibility is used as the element group.

33. A manufacturing method of a semiconductor device, comprising:
   forming a peeling layer over a first substrate;
   forming an element layer over the peeling layer, wherein the element layer includes an element formation layer including a transistor, a conductive film formed over the element formation layer so as to be electrically connected to the transistor, and a protective film formed so as to cover an edge portion of the conductive film;
   attaching a first sheet material to the element layer, and then peeling the element layer and the first sheet material from the first substrate;
   attaching a second sheet material to a surface of the element layer that is exposed by the peeling, and then peeling the first sheet material from the element layer;
   forming a conductive bump over the protective film so as to be electrically connected to the conductive film, so that an element group including the element layer, the conductive bump, and the second sheet material is formed;
   placing a second substrate over a pressure detection film;
   placing the element group selectively over the second substrate so that a conductive film functioning as an antenna formed over the second substrate and the conductive bump overlap each other;

pressure-bonding the second substrate and the element group so that the conductive film formed over the second substrate and the conductive bump are electrically connected to each other;

detecting a value and distribution of pressure applied to the element group, by the pressure detection film, at a time of the pressure bonding; and controlling pressure applied to the element group after the detection, based on the detected value and distribution of pressure.

34. A manufacturing method of a semiconductor device according to claim 33, wherein a silicon diaphragm pressure sensor is used as the pressure detection film.

35. A manufacturing method of a semiconductor device according to claim 33, wherein a pressure sensor with a pressure-sensitive conductive rubber interposed between a pair of electrodes is used as the pressure detection film.

36. A manufacturing method of a semiconductor device, according to claim 33, wherein an anisotropic conductive film or an anisotropic conductive paste is interposed between the second substrate and the element group, when the second substrate and the element group are placed overlapping each other.

37. A manufacturing method of a semiconductor device, according to claim 33, wherein a heat treatment is concurrently performed at the time of the pressure bonding.

38. A manufacturing method of a semiconductor device, according to claim 33, wherein a film having flexibility is used as the second sheet material.

* * * * *

UNITED STATES PATENT AND TRADEMARK OFFICE
CERTIFICATE OF CORRECTION

PATENT NO. : 7,635,014 B2  Page 1 of 1
APPLICATION NO. : 11/591776
DATED : December 22, 2009
INVENTOR(S) : Takahashi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 427 days.

Signed and Sealed this

Twenty-first Day of December, 2010

David J. Kappos
*Director of the United States Patent and Trademark Office*